US012625180B2

(12) United States Patent (10) Patent No.: US 12,625,180 B2
Kerber et al. (45) Date of Patent: May 12, 2026

(54) DIAGNOSTIC RING OSCILLATOR CIRCUIT FOR DC AND TRANSIENT CHARACTERIZATION

(71) Applicant: Intel NDTM US LLC, Santa Clara, CA (US)

(72) Inventors: Andreas Kerber, Pleasanton, CA (US); Phillip Kliza, Folsom, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/622,645

(22) Filed: Mar. 29, 2024

(65) Prior Publication Data

US 2024/0243735 A1      Jul. 18, 2024

Related U.S. Application Data

(60) Provisional application No. 63/535,044, filed on Aug. 28, 2023.

(51) Int. Cl.
G01R 31/319      (2006.01)
G01R 31/26      (2020.01)
      (Continued)

(52) U.S. Cl.
CPC ...  G01R 31/31915 (2013.01); G01R 31/2626 (2013.01); G01R 31/31905 (2013.01);
      (Continued)

(58) Field of Classification Search
CPC .......... G01R 31/31915; G01R 31/2626; G01R 31/31905; G01R 31/2642; G01R 31/2855;
      (Continued)

(56) References Cited

U.S. PATENT DOCUMENTS 6,476,632 B1 *  11/2002  La Rosa ............ G01R 31/2824
                                                        324/762.05
7,642,864 B2 *  1/2010  Chuang ................ H03K 3/0315
                                                        324/649
                (Continued)

FOREIGN PATENT DOCUMENTS

CN      105093086 A  * 11/2015  ......... G01R 31/2858
JP      2013188466 A  * 9/2013  ............... H04N 7/22

OTHER PUBLICATIONS

Andreas Kerber et al., Notice of Allowance, U.S. Appl. No. 18/396,111, Jul. 18, 2025, 11 pgs.

*Primary Examiner* — Lincoln D Donovan
*Assistant Examiner* — James G Yeaman
(74) *Attorney, Agent, or Firm* — Morgan, Lewis & Bockius LLP

(57)      ABSTRACT

A ring oscillator (RO) circuit for capturing one or more characteristics relating to aging of CMOS circuitry in a CMOS device has been described. The RO circuit includes a plurality of stages coupled via an RO feedback signal line and forming an inverter chain. The plurality of stages include, for each stage, a respective CMOS inverter comprising a pair of pMOS and nMOS transistors followed by a pass gate, wherein an output of a pass gate for a stage is coupled to an input for the respective CMOS inverter of a next stage. The plurality of stages include an enable stage to enable the inverter chain to be put into a free oscillating mode or another mode in which the RO circuit does not freely oscillate. The plurality of stages include a Device Under Test (DUT) stage preceded by a pre-stage where respective supply rails of the DUT stage and pre-stage are isolated from one another.

20 Claims, 20 Drawing Sheets

(51) Int. Cl.
  *H03K 3/03*         (2006.01)
  *H03K 3/354*      (2006.01)
  *H03K 17/687*     (2006.01)
  *H03K 19/0185*   (2006.01)

(52) U.S. Cl.
  CPC ........... *H03K 3/0315* (2013.01); *H03K 3/354* (2013.01); *H03K 17/6872* (2013.01); *H03K 19/018521* (2013.01); *H03K 2217/0054* (2013.01)

(58) Field of Classification Search
  CPC ............ G01R 31/2858; G01R 31/2874; G01R 31/2621; G01R 31/2824; G01R 31/2849; G01R 31/2879; G01R 31/3016; H03K 3/0315; H03K 3/354; H03K 17/6872; H03K 19/018521; H03K 2217/0054; H03K 19/0013; H03K 19/0948; H03K 19/20; H03K 2217/0036; H03K 3/012; H03K 3/356139; H03K 17/08122; H03K 19/0185; H03K 19/00315; H03K 19/00323; H03K 3/356182; H03K 19/00; H03K 19/0175; H03K 19/08; H03K 19/094; H03K 19/21; H03K 2217/0081; G11C 8/08; H01L 22/34; H02M 1/088; H02M 1/38
  See application file for complete search history.

(56) References Cited

U.S. PATENT DOCUMENTS

| | | | |
|---|---|---|---|
| 10,114,068 B1 | 10/2018 | Chen et al. | |
| 2009/0189703 A1 | 7/2009 | Chuang et al. | |
| 2011/0193586 A1 | 8/2011 | Kuo et al. | |
| 2019/0137563 A1* | 5/2019 | Kwon ................ | G01R 31/2621 |
| 2024/0133952 A1 | 4/2024 | Kerber et al. | |

* cited by examiner $$f_{out} = \frac{f_{RO}}{2^M}$$

| | RO Stress dynamic | RO Stress static | RO Sense | NFET sense | PFET sense |
|---|---|---|---|---|---|
| V+ | Vstress | Vstress | VDDnom | VDDnom | VDDnom |
| GND | GND | GND | GND | GND | GND |
| RO control | Vstress | Vstress | VDDnom | GND | GND |
| RO not control | GND | GND | GND | VDDnom | VDDnom |
| DUT header | GND | GND | GND | VDDnom | GND |
| DUT footer | Vstress | Vstress | VDDnom | VDDnom | VDDnom |
| Enable RO | Vstress | GND | VDDnom | GND | GND |
| Not Enable RO | GND | Vstress | GND | VDDnom | VDDnom |
| Set static bias | na | Vstress = NBTI / nNCS GND = PBTI / pNCS | na | na | na |

Fig. 12a
Fig. 12b
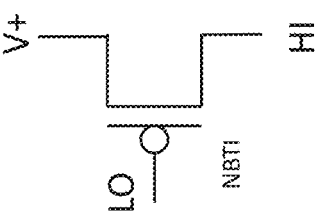
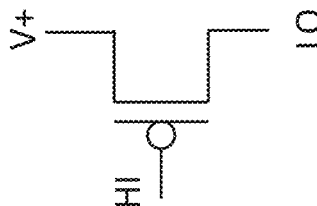
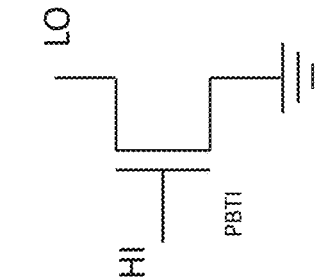
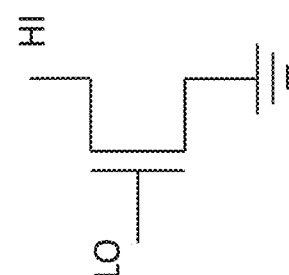

Fig. 12c
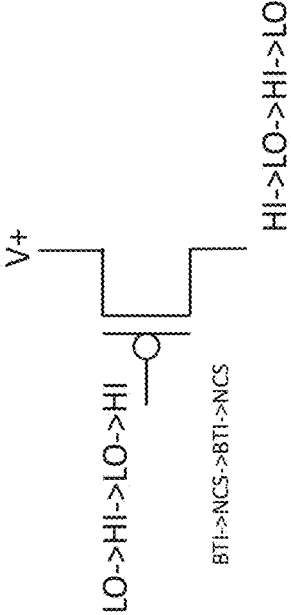
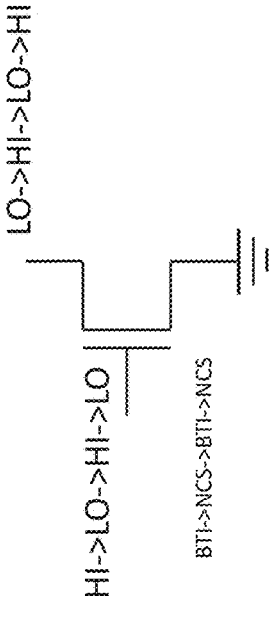
CHC

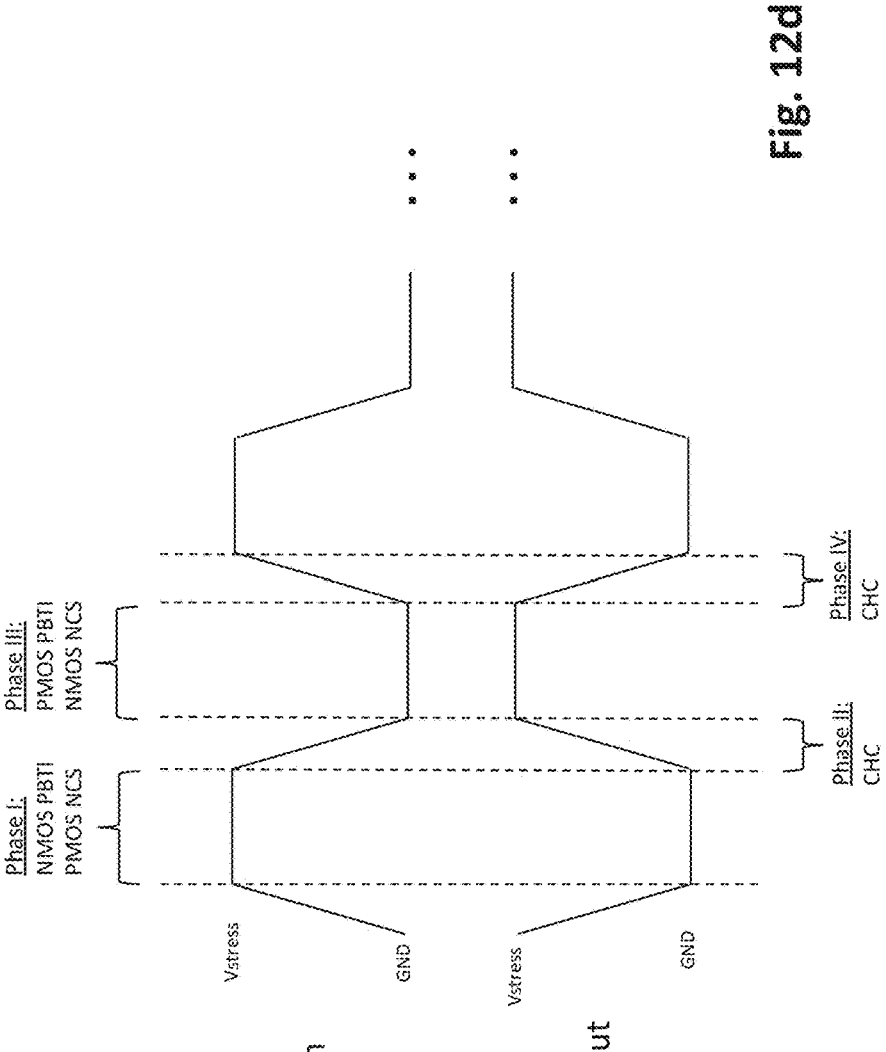
Fig. 12d
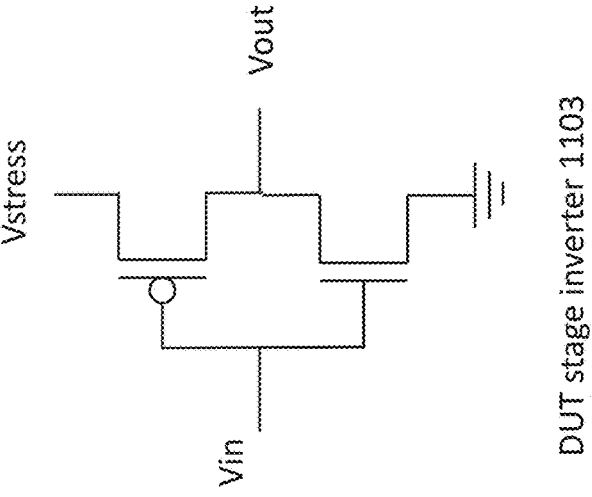
DUT stage inverter 1103

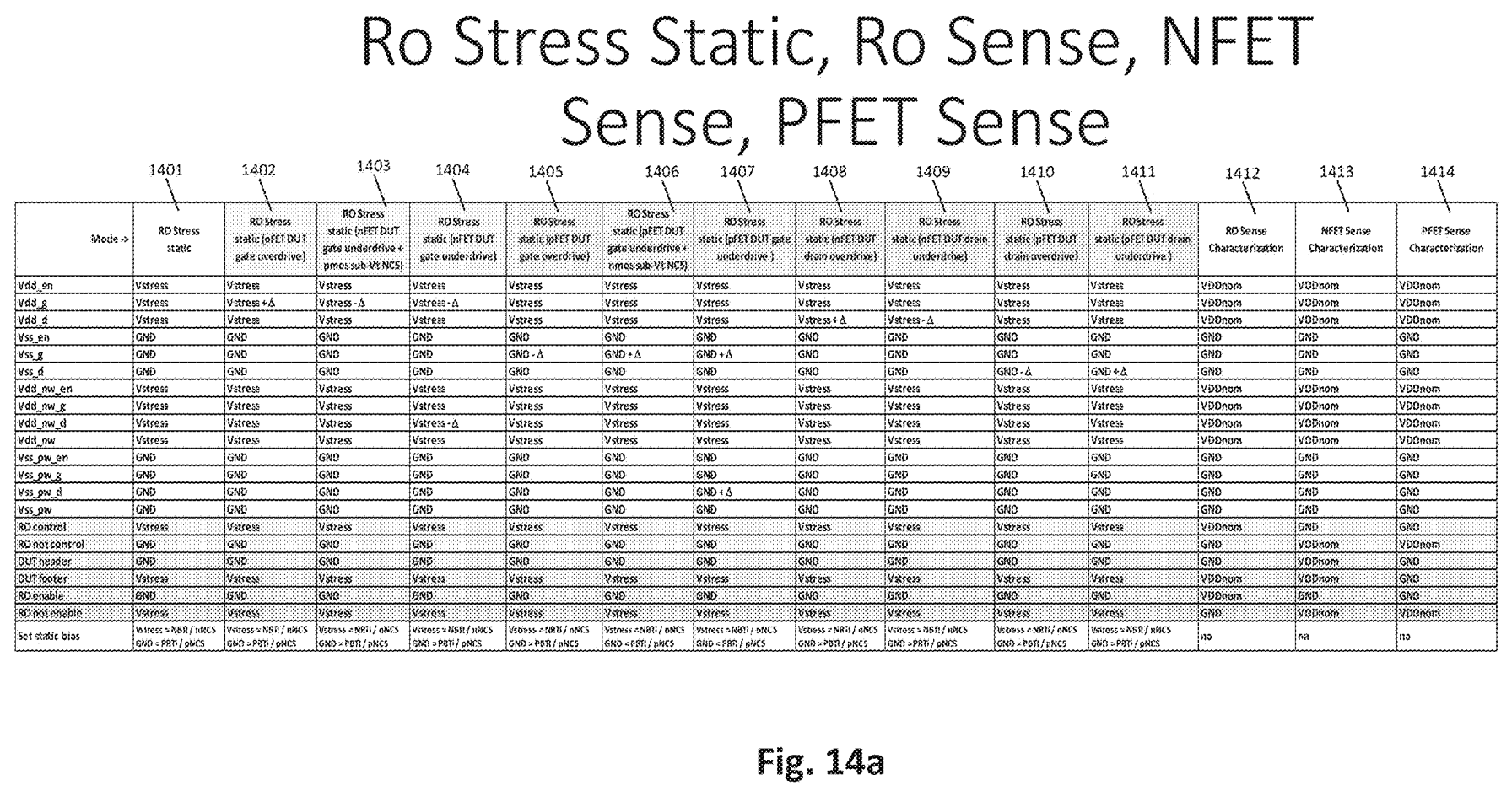

Ro Stress Static, Ro Sense, NFET Sense, PFET Sense

| Mode -> | RO Stress static | RO Stress static (nFET DUT gate overdrive) | RO Stress static (nFET DUT gate underdrive + pmos sub-Vt NC5) | RO Stress static (pFET DUT gate underdrive) | RO Stress static (pFET DUT gate overdrive) | RO Stress static (pFET DUT gate underdrive + nmos sub-Vt NC5) | RO Stress static (pFET DUT gate underdrive) | RO Stress static (nFET DUT drain overdrive) | RO Stress static (nFET DUT drain underdrive) | RO Stress static (pFET DUT drain overdrive) | RO Stress static (pFET DUT drain underdrive) | RO Sense Characterization | NFET Sense Characterization | PFET Sense Characterization |
|---|---|---|---|---|---|---|---|---|---|---|---|---|---|---|
| | 1401 | 1402 | 1403 | 1404 | 1405 | 1406 | 1407 | 1408 | 1409 | 1410 | 1411 | 1412 | 1413 | 1414 |
| Vdd_en | Vstress | Vstress | Vstress | Vstress | Vstress | Vstress | Vstress | Vstress | Vstress | Vstress | Vstress | VDDnom | VDDnom | VDDnom |
| Vdd_g | Vstress | Vstress + Δ | Vstress - Δ | Vstress | Vstress | Vstress | Vstress | Vstress + Δ | Vstress | Vstress | Vstress | VDDnom | VDDnom | VDDnom |
| Vdd_d | Vstress | Vstress | Vstress | Vstress | Vstress | Vstress | Vstress | Vstress - Δ | Vstress - Δ | GND | Vstress | VDDnom | VDDnom | GND |
| Vss_en | GND | GND | GND | GND | GND | GND | GND | GND | GND | GND | GND | GND | GND | GND |
| Vss_g | GND | GND | GND | GND | GND - Δ | GND + Δ | GND + Δ | GND | GND | GND - Δ | GND + Δ | GND | GND | GND |
| Vss_d | GND | GND | GND | GND | GND | GND | GND | GND | GND | GND | GND + Δ | VDDnom | VDDnom | VDDnom |
| Vdd_nw_en | Vstress | Vstress | Vstress | Vstress | Vstress | Vstress | Vstress | Vstress | Vstress | Vstress | Vstress | VDDnom | VDDnom | VDDnom |
| Vdd_nw_g | Vstress | Vstress | Vstress | Vstress | Vstress | Vstress | Vstress | Vstress | Vstress | Vstress | Vstress | VDDnom | VDDnom | VDDnom |
| Vdd_nw_d | Vstress | Vstress | Vstress | Vstress - Δ | Vstress | Vstress | Vstress | Vstress | Vstress | Vstress | Vstress | VDDnom | VDDnom | VDDnom |
| Vdd_nw | Vstress | Vstress | Vstress | Vstress | Vstress | Vstress | Vstress | Vstress | Vstress | Vstress | Vstress | VDDnom | VDDnom | VDDnom |
| Vss_pw_en | GND | GND | GND | GND | GND | GND | GND | GND | GND | GND | GND | GND | GND | GND |
| Vss_pw_g | GND | GND | GND | GND | GND | GND | GND | GND | GND | GND | GND | GND | GND | GND |
| Vss_pw_d | GND | GND | GND | GND | GND | GND | GND | GND | GND | GND | GND | GND | GND | GND |
| Vss_pw | GND | GND | GND | GND | GND | GND | GND | GND | GND | GND | GND | GND | GND | GND |
| RO control | Vstress | Vstress | Vstress | Vstress | Vstress | Vstress | Vstress | Vstress | Vstress | Vstress | Vstress | VDDnom | GND | GND |
| RO test control | GND | GND | GND | GND | GND | GND | GND | GND | GND | GND | GND | GND | GND | VDDnom |
| DUT header | GND | GND | GND | GND | GND | GND | GND | GND | GND | GND | GND | GND | GND | GND |
| DUT footer | Vstress | Vstress | Vstress | Vstress | Vstress | Vstress | Vstress | Vstress | Vstress | Vstress | Vstress | VDDnom | VDDnom | GND |
| RO disable | Vstress | Vstress | Vstress | Vstress | Vstress | Vstress | Vstress | Vstress | Vstress | Vstress | Vstress | GND | GND | GND |
| RO mod enable | Vstress | Vstress | Vstress | Vstress | Vstress | Vstress | Vstress | Vstress | Vstress | Vstress | Vstress | GND | GND | VDDnom |
| Set static bias | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | Vstress = NBTI / nNCS GND = PBTI / pNCS | no | na | no |

Fig. 14a

Dynamic

| Mode -> | RO Stress dynamic (1411) | RO Stress dynamic (nFET DUT gate overdrive) (1412) | RO Stress dynamic (nFET DUT gate underdrive + pmos sub-Vt NCS) (1413) | RO Stress dynamic (nFET DUT gate underdrive) (1414) | RO Stress dynamic (pFET DUT gate overdrive) (1415) | RO Stress dynamic (pFET DUT gate underdrive + nmos sub-Vt NCS) (1416) | RO Stress dynamic (pFET DUT gate underdrive) (1417) | RO Stress dynamic (nFET DUT drain overdrive) (1418) | RO Stress dynamic (nFET DUT drain underdrive) (1419) | RO Stress dynamic (pFET DUT drain overdrive) (1420) | RO Stress dynamic (pFET DUT drain underdrive) (1421) | RO Sense Characterization (1422) |
|---|---|---|---|---|---|---|---|---|---|---|---|---|
| Vdd_en | Vstress | Vstress | Vstress | Vstress | Vstress | Vstress | Vstress | Vstress | Vstress | Vstress | Vstress | VDDnom |
| Vdd_g | Vstress | Vstress + Δ | Vstress - Δ | Vstress - Δ | Vstress | Vstress | Vstress | Vstress + Δ | Vstress - Δ | Vstress | Vstress | VDDnom |
| Vdd_d | Vstress | Vstress | Vstress | Vstress | Vstress | Vstress | Vstress | Vstress | Vstress - Δ | Vstress | Vstress | VDDnom |
| Vss_en | GND | GND | GND | GND | GND | GND | GND | GND | GND | GND | GND | GND |
| Vss_g | GND | GND | GND | GND | GND - Δ | GND + Δ | GND + Δ | GND | GND | GND - Δ | GND + Δ | GND |
| Vss_d | GND | GND | GND | GND | GND | GND | GND | GND | GND | GND | GND | GND |
| Vdd_nw_en | Vstress | Vstress | Vstress | Vstress | Vstress | Vstress | Vstress | Vstress | Vstress | Vstress | Vstress | VDDnom |
| Vdd_nw_g | Vstress | Vstress | Vstress | Vstress | Vstress | Vstress | Vstress | Vstress | Vstress | Vstress | Vstress | VDDnom |
| Vdd_nw_d | Vstress | Vstress | Vstress | Vstress - Δ | Vstress | Vstress | Vstress | Vstress | Vstress | Vstress | Vstress | VDDnom |
| Vdd_nw | Vstress | Vstress | Vstress | Vstress | Vstress | Vstress | Vstress | Vstress | Vstress | Vstress | Vstress | VDDnom |
| Vss_pw_en | GND | GND | GND | GND | GND | GND | GND | GND | GND | GND | GND | GND |
| Vss_pw_g | GND | GND | GND | GND | GND | GND | GND + Δ | GND | GND | GND | GND | GND |
| Vss_pw_d | GND | GND | GND | GND | GND | GND | GND | GND | GND | GND | GND | GND |
| Vss_pw | GND | GND | GND | GND | GND | GND | GND | GND | GND | GND | GND | GND |
| RO control | Vstress | Vstress | Vstress | Vstress | Vstress | Vstress | Vstress | Vstress | Vstress | Vstress | Vstress | VDDnom |
| RO net control | GND | GND | GND | GND | GND | GND | GND | GND | GND | GND | GND | GND |
| DUT header | GND | GND | GND | GND | GND | GND | GND | GND | GND | GND | GND | GND |
| DUT footer | Vstress | Vstress | Vstress | Vstress | Vstress | Vstress | Vstress | Vstress | Vstress | Vstress | Vstress | VDDnom |
| RO enable | Vstress | Vstress | Vstress | Vstress | Vstress | Vstress | Vstress | Vstress | Vstress | Vstress | Vstress | VDDnom |
| RO net enable | GND | GND | GND | GND | GND | GND | GND | GND | GND | GND | GND | GND |
| Set static bias | na | na | na | na | na | na | na | na | na | na | na | na |

Fig. 14b

DIAGNOSTIC RING OSCILLATOR CIRCUIT FOR DC AND TRANSIENT CHARACTERIZATION

CROSS-REFERENCE TO RELATED APPLICATION

This application claims the benefit of the filing date of U.S. Provisional Application No. 63/535,044, filed Aug. 28, 2023, entitled "DIAGNOSTIC RING OSCILLATOR CIR-CUIT FOR DC AND TRANSIENT CHARACTERIZA-TION" under 35 U.S.C. § 119(e). U.S. Provisional Application No. 63/535,044 is further incorporated herein in its entirety for all purposes.

BACKGROUND INFORMATION

Manufacturers and designers of semiconductor devices desire to have the ability to quantify different aging phenomena and their interactions while measuring their effect on numerous parameters/metrics in situ. For example, quantifying key device degradation components like Negative Bias Temperature Instability (NBTI) and Channel Hot Carrier (CHC) degradation remains a critical reliability challenge not only in advanced technology nodes using metal gate/high-k (MG/HK) dielectrics but also for conventional CMOS technologies with poly-Si gates and SiO2 or SiON gate dielectrics.

Ring-oscillator (RO) circuits are used to capture the aging kinetics of digital circuits in CMOS technologies. The introduction of time-resolved RO characterization made it feasible to separate NBTI and CHC components during standard wafer level stress conditions (the RO circuit is integrated on a wafer having respective circuitry for multiple chips and the RO circuit is tested to measure reliability characteristics of the transistors of the multiple chips' respective circuitry). A reduction in measurement delay in RO circuit characterization was beneficial for decoupling the NBTI and CHC aging mechanisms which differ in voltage dependence and time evolution. This is consistent with what was previously observed for BTI characterization in discrete devices, which typically yielded reduced power law time evolution with shorter measurement delays.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 9 is a table illustrating various parameters and input used to configure a DFR RO circuit for different types of testing;

FIGS. 12a, 12b, 12c and 12d depict different transistor stress conditions;

FIGS. 14a and 14b show different test mode configurations for the improved RO circuit of FIG. 13.

DETAILED DESCRIPTION

1.0 Introduction

Figures 1, 2:
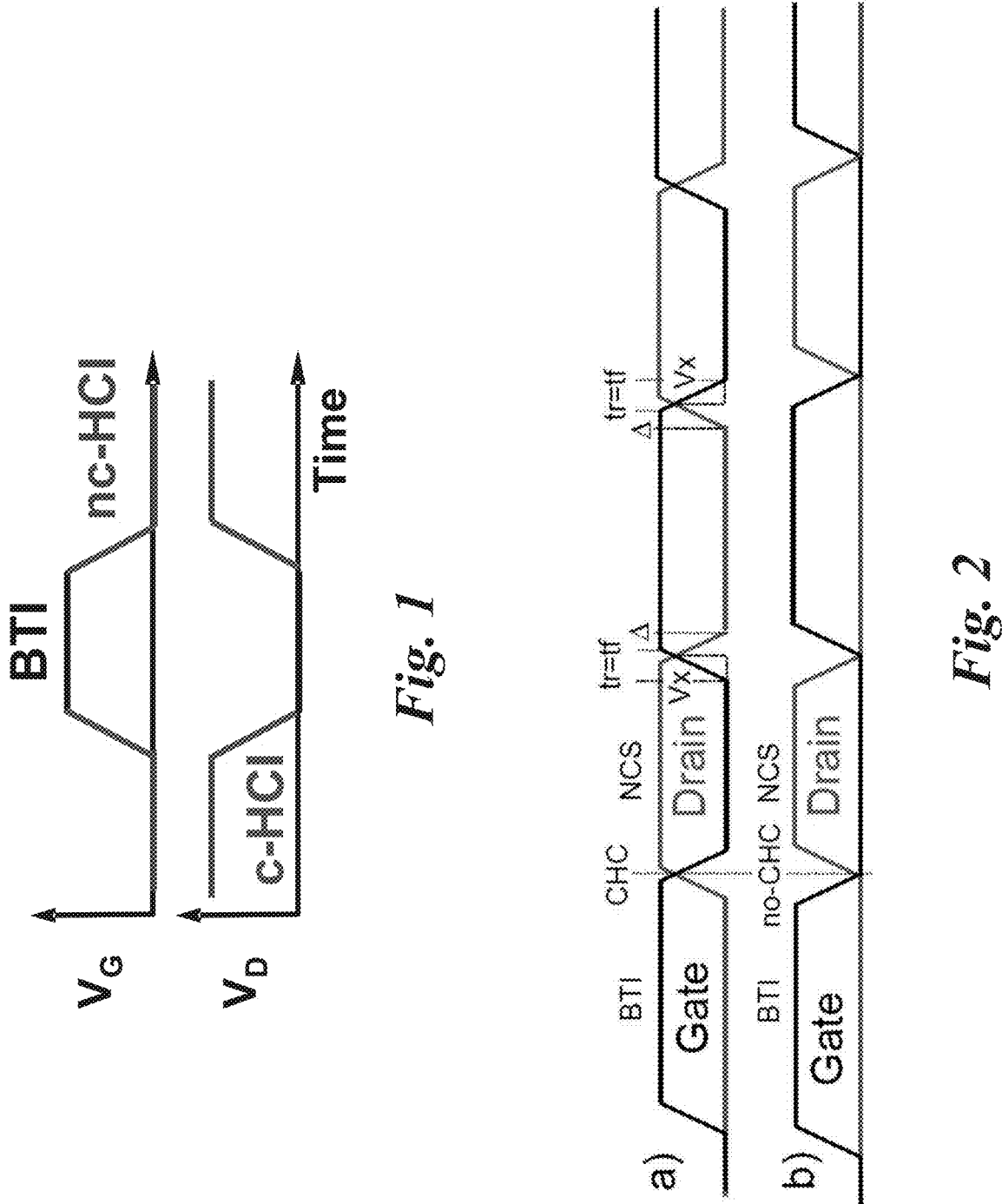
FIG. 1 is a diagram showing relevant degradation mechanisms for digital circuit aging modes.
FIG. 2 is a diagram showing typical applied voltage waveforms on drain and gate terminal during AC-CHC (non-zero current crossing condition) inverter and no-CHC (zero current crossing condition) inverter stress testing.

Embodiments of methods and apparatus for diagnostic ring oscillator (RO) circuit for DC-static and transient characterization are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

The relevant degradation mechanisms for digital circuit aging modes are summarized in FIG. 1, where VG is gate voltage and VD is drain voltage. During on-state pMOS devices exhibit NBTI while MG/HK nMOS devices show PBTI due to charge trapping in the HK dielectric and conventional poly-Si/SiO2 or SiON devices may also experience degradation at high stress voltages either related to Fowler-Nordheim (FN) injection or direct-tunneling (DT) currents. In the off-state, Non-Conducting Stress (NCS) aging can occur caused by hot carriers originating from either diffusion currents along the channel or band-to-band tunneling across the reversed bias drain junction. Switching between the on-state and off-state leads to CHC degradation which is typically most pronounced when the gate is biased at ~½ of the drain voltage for conventional CMOS devices with gate length ≥90 nm and when gate is approximately equal to drain for shorter gate length.

To better mimic the degradation modes in digital CMOS circuits AC stress methodologies may be used to study the recovery effects for NBTI in discrete pMOS devices (also referred to as PFETs). During AC stress the voltage levels on the gate terminal are typically altered between stress voltage and ground (GND) with drain terminal grounded while in the inverter (INV) stress mode the signal applied to the drain terminal is inverted with respect to the gate terminal.

To measure the CHC degradation of digital CMOS devices an AC-CHC methodology can be used that is based on current flow during device switching. A typical applied voltage waveform which alters the current flow on drain and gate terminals during AC-CHC stress is shown in FIG. 2a. A digital waveform is applied to the gate and an inverted waveform to the drain of a discrete MOSFET with a specified frequency, duty cycle, rise & fall time. To modulate the CHC contribution, the gate and drain voltage signals are offset by a time A using synchronized remote sense amplifier units, the result of which can be seen in FIG. 2a. The choice of A determines the gate and drain voltage crossover (Vx). The transition time is defined as the duration for switching the drain voltage between the stress bias and ground which for symmetric gate and drain voltage waveforms is equal to the rise ($t_r$) and fall ($t_f$) times of the digital signal. For a symmetric waveform with $t_r$=$t_f$ the cross-point voltage is given by, $$Vx = Vstress\left(\frac{t_r + \Delta}{2 \cdot t_r}\right) = \left(\frac{t_f + \Delta}{2 \cdot t_f}\right),$$

where Vstress is the supply voltage for CMOS circuits. For typical logic designs the crossover voltage ratio (Vx/Vstress) can range typically from ~0.7 to 0.85 and is determined by the strength of the devices and the load capacitance.

A second inverter waveform is considered (see FIG. 2b) where the crossover voltage ratio is 0 (non-overlapping) which means there is no channel current flowing while transitioning from the on-state to the off-state and vice versa, eliminating CHC degradation and is referred to as no-CHC inverter stress. Comparing AC-CHC inverter stress results with a Vx/Vstress=0.8 and no-CHC with a Vx/Vstress=0 versus the DC mid-Vg CHC stress provides valuable insights into the individual aging components under digital operation condition.

Figures 3, 4, 5, 6:
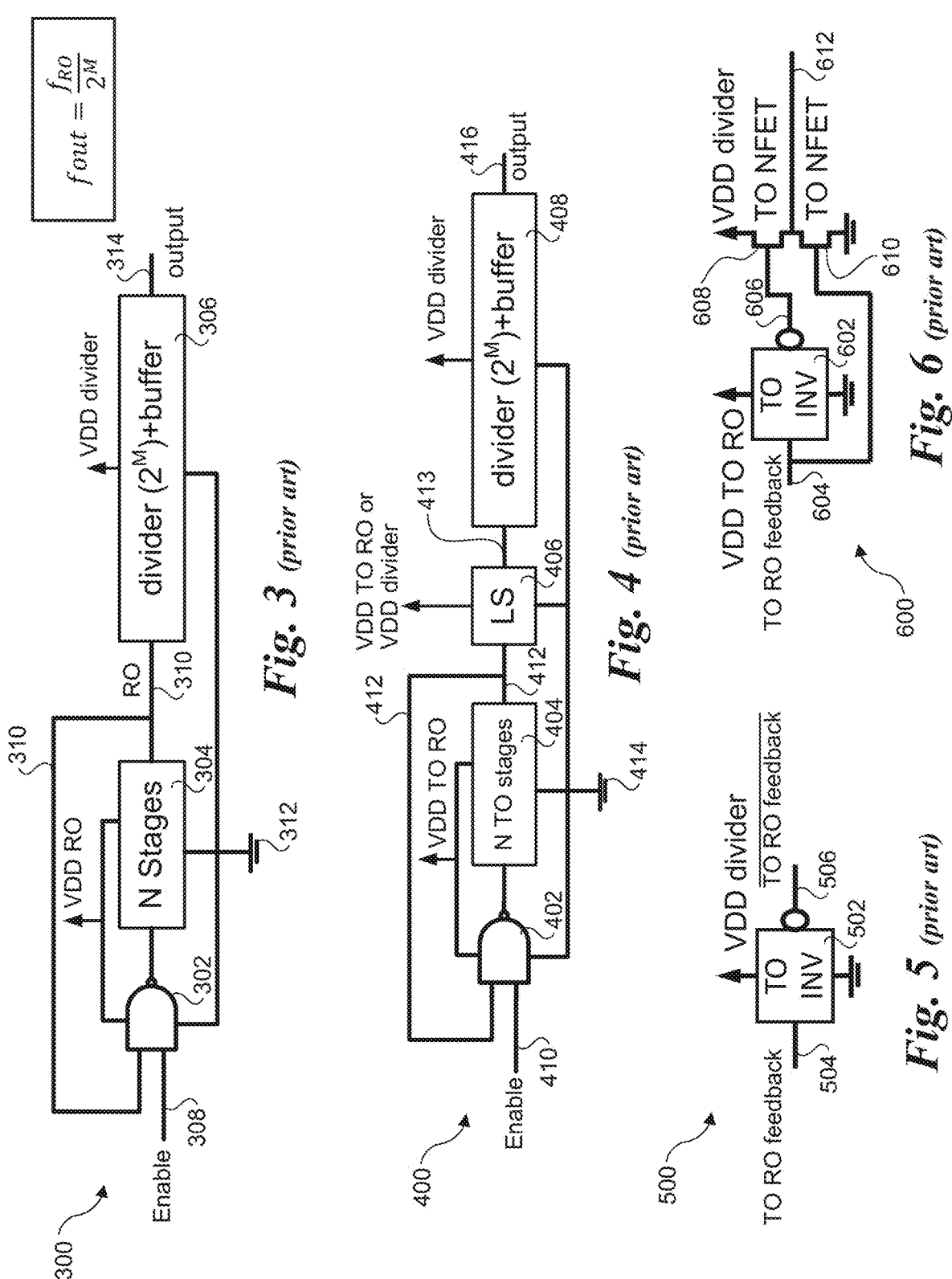
FIG. 3 shows an example of a RO test configuration for testing thin oxide CMOS devices.
FIG. 4 shows an example of a RO test configuration for testing thick oxide CMOS devices.
FIGS. 5 and 6 illustrate example circuits for the level shifter (LS) used in the RO test configuration of FIG. 4.

FIG. 3 shows a high-level view of a conventional RO design 300. The block-level components include a NAND gate 302, N stages 304 and a divider and buffer 306. The inputs to NAND gate 302 include an enable signal 308 and an RO feedback signal 310. A high-side supply voltage VDD RO is provided to NAND gate 302 and each of N stages 304 while a separate high-side supply voltage VDD divider is provided to divider and buffer 306. The low side supply voltage of NAND gate 302, each of N stages 304, and divider and buffer 306 are tied to ground 312. The input of divider and buffer 306 can be the RO feedback signal 310, which has its frequency divided by $2^M$ to produce the output signal 314 used to measure the RO frequency.

RO design 300 includes an even number of inverting stages plus an enable NAND gate for an odd number of total stages. The enable gate is set to '0' for static DC-Static and AC-Open Loop and to '1' for dynamic AC-Closed Loop operation.

FIG. 4 shows a high-level view of a thick oxide (TO) RO design 400. The block-level components include a NAND gate 402, N TO stages 404, a Level Shifter (LS) 406 and a divider and buffer 408. The inputs to NAND gate 402 include an enable signal 410 and an RO feedback signal 412. A high-side supply voltage VDD TO RO is provided to NAND gate 402 and each of N TO stages 404 while a high-side supply voltage VDD divider is provided to divider and buffer 408 consistent with the voltage specifications for thin oxide devices. Either VDD TO RO or VDD divider is provided as the high side supply voltage to LS 406. The low side supply voltage of NAND gate 402, each of N TO stages 404, LS 406, and divider and buffer 408 are tied to ground 414.

As the divider and output buffer stage are typically designed for thin oxide devices, LS 406 is inserted between the output of N TO stages 404 and divider and buffer 408 to prevent TDDB failure of the divider input stage. The level-shifted RO feedback signal 413 has its frequency divided by $2^M$ by divider and buffer 408, which outputs a signal 416 that is used to measure the divided TO RO frequency.

FIGS. 5 and 6 show examples of two basic level shifter circuits 500 and 600. Level shifter circuit 500 includes a thick oxide inverter 502 that is coupled between the VDD divider voltage used for thin oxide devices and ground. TO inverter 502 inverts a TO RO feedback signal 504 and outputs an inverted TO RO feedback signal 506. Level shifter circuit 600 includes a TO inverter 602 supplied with VDD TO RO that inverts a TO RO feedback signal 604 and outputs an inverted TO RO feedback signal 606 that is coupled to the gate of a TO NFET 608 (e.g., a TO nMOS transistor). A VDD divider voltage is coupled to the source of TO NFET 608, while the drain of TO NFET 608 is coupled to the source of a TO NFET 610, whose drain is coupled to ground. TO RO feedback signal 604 is coupled to the gate of TO NFET 610. Level shifter circuit 600 generates an output 612, which is coupled between the drain of TO NFET 608 and the source of TO NFET 610.

2.0 Design for Reliability (DFR) Ring Oscillator (RO) Circuit

RO's may be used to study aging of digital CMOS circuits, as testing only requires either a frequency counter or digital oscilloscope to implement with standard parametric test equipment. Under the embodiments herein the design for a Design-For-Reliability (DFR) RO is optimized to enable dynamic and static aging where in static mode the stage for device characterization can be put in either NBTI/nMOS NCS or PBTI/pMOS NCS stress mode. Due to the heavy internal capacitance of large pass-gates the oscillator frequencies are a few hundred Megahertz at the reference voltage of 1.2V for thin oxide and 2.5V for thick oxide RO's. An embodiment of the optimized DFR RO implementation is illustrated in FIGS. 7, 7a, 7b, and 7c. This design allows for static NBTI/PBTI characterization and frequency readouts in a single design that follows the bias configuration summarized in table 900 of FIG. 9 below. Basically, the conventional NAND enable stage is replaced by an inverter with stacked power-gating transistors. The pass-gates of this stage allow setting the static inverter chain into a defined logic state. The RO high side supply voltage (VDD) and low side supply voltage/ground (GND), six control terminals (header, footer, two control, two enable) and external static bias, the supply terminal of the peripheral divider/buffer circuits, and frequency output terminal require up to 10 independent Source-Measurement-Unit (SMU) terminals and one oscilloscope channel. To simplify the test code the standard stress and single-spot-sense method may be adopted, thus either frequency or nMOS on-current or pMOS on-current are measured with a sense duration of approximately 2 ms to minimize recovery effects.

Figure 7:
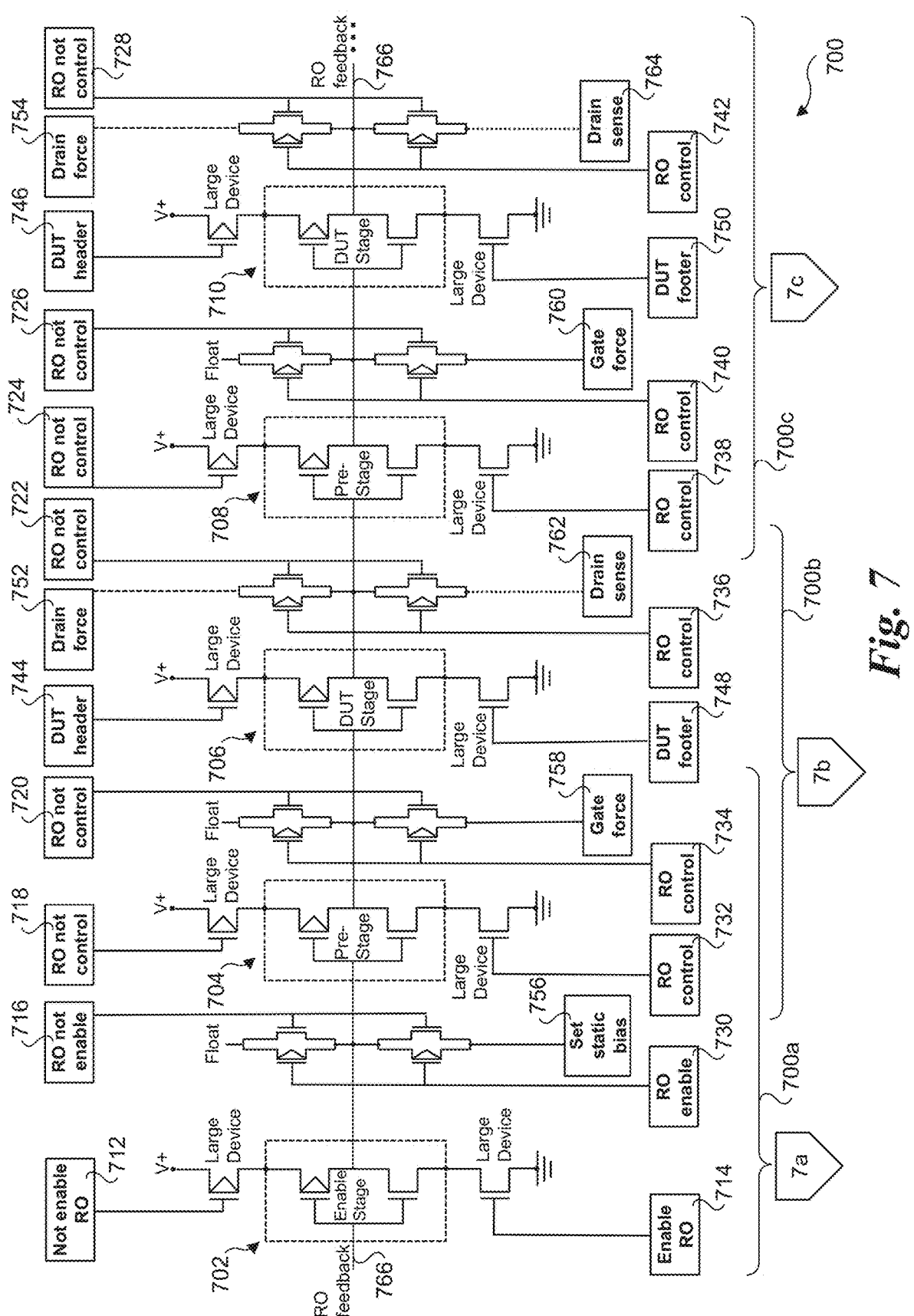
FIG. 7 shows a first example of a DFR RO circuit, according to one embodiment.
Figure 7A:
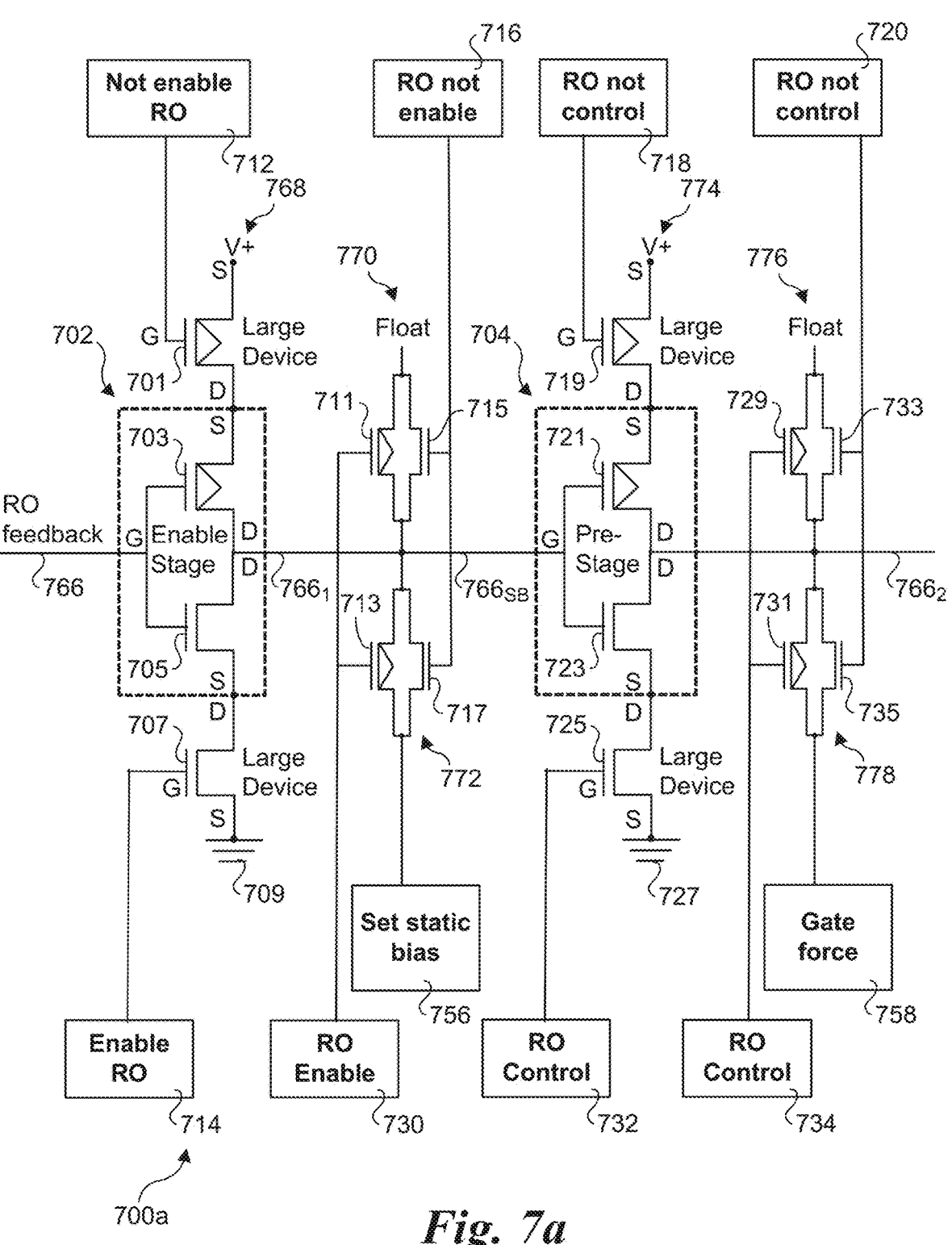
FIGS. 7a, 7b, and 7c show further details of the DFR RO circuit of FIG. 7.
Figure 7B:
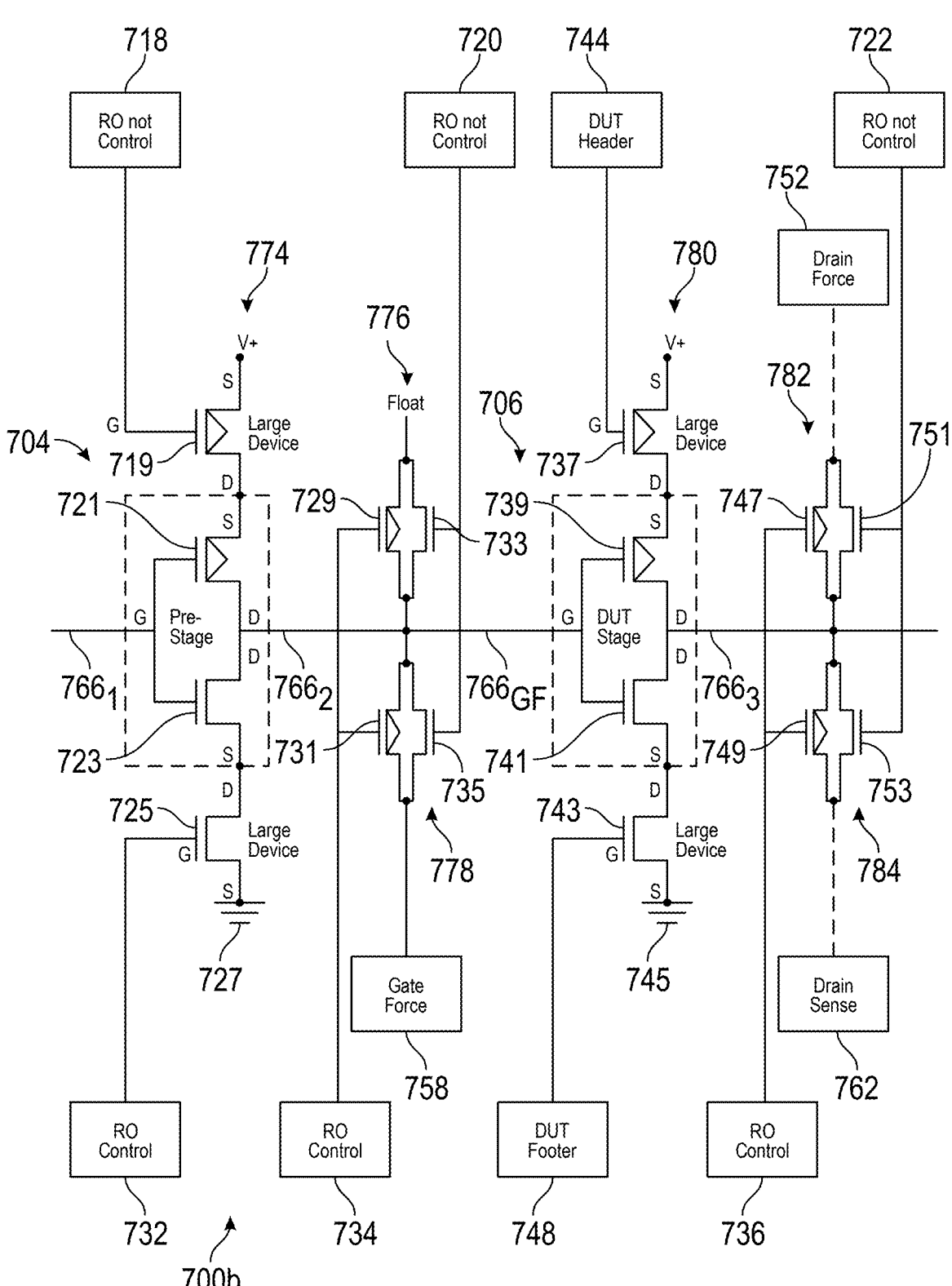
Figure 7C:
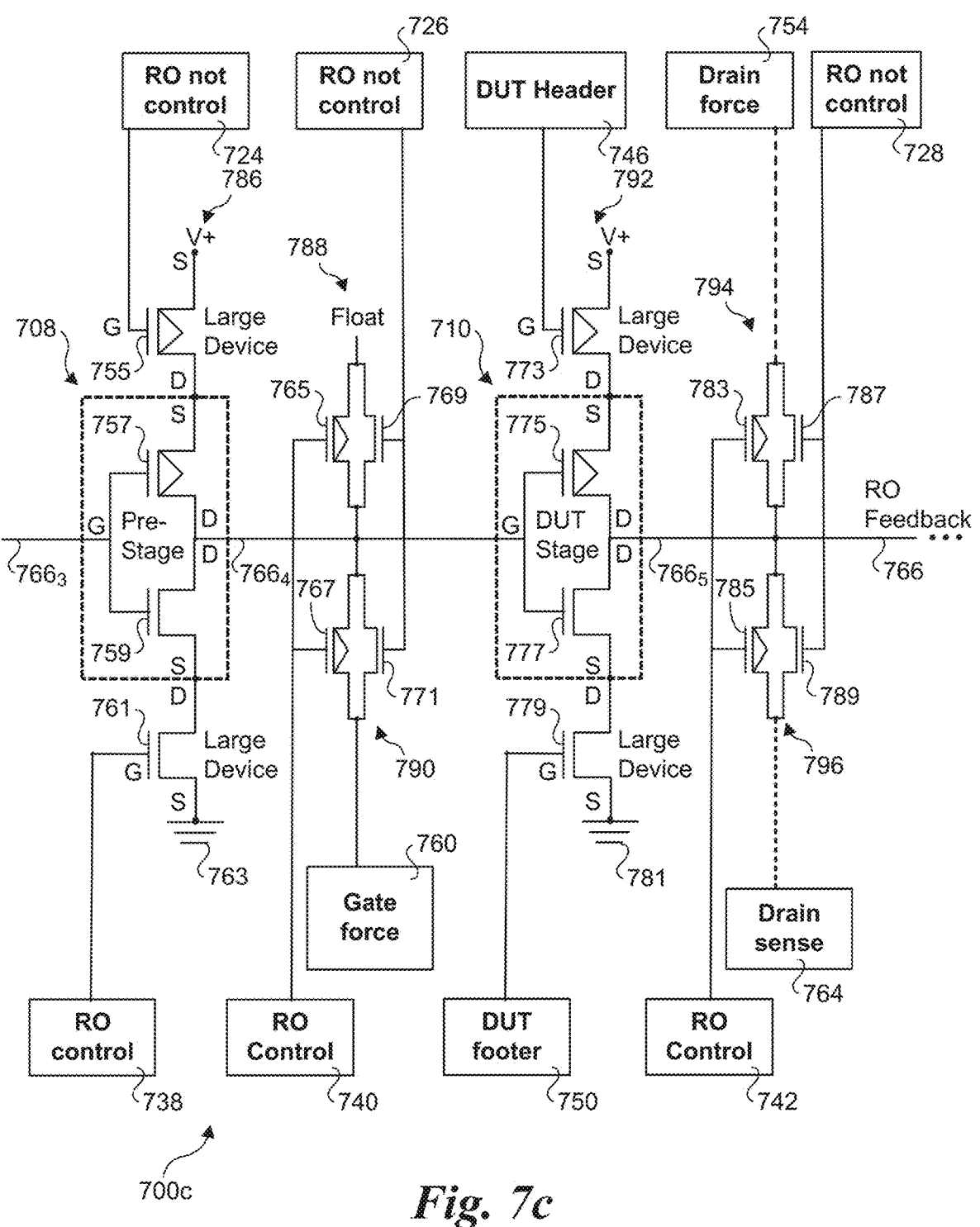

FIG. 7 shows an optimized design for a DFR-RO circuit 700 comprising symmetric stages forming an inverter chain and employing header and footer devices and pass gates, with further details of stages and associated circuitry shown in FIGS. 7a, 7b, and 7c. As illustrated, various inputs may be enabled or disabled (not enabled) for different tests and/or at different stages, including RO and RO not control. DFR-RO circuit 700 further provides inputs for a DUT (Device Under Test) header and footer, along with pass gates that facilitate drain force inputs and measurement of drain sense signals. Additionally, NBTI/PBTI stress modes may be enabled through an enhanced enable circuit with external static bias option.

DFR RO circuit 700 includes an enable stage 702 followed in order by a pre-stage 704, a DUT stage 706, a pre-stage 708, and a DUT stage 710. Various control terminals provide control inputs to the circuitry of DFR RO circuit 700, including a not enable RO control terminal 712, an enable RO control terminal 724, an RO not enable control terminal 716, RO not control terminals 718, 720, 722, 724, and 728, an RO enable terminal 730, and RO control terminals 732, 734, 736, 738, 740, and 742. Other inputs are provided by DUT header terminals 744 and 746, DUT footer terminals 748 and 750, drain force inputs 752 and 754, a set static bias input 756, and gate force inputs 758 and 760. DFR RO circuit 700 also includes drain senses 762 and 764. An RO feedback signal 766 is operatively coupled to and passes through each of enable stage 702, pre-stage 704, DUT stage 706, pre-stage 708, and DUT stage 710. DFR RO circuit 700 further comprises first and second instances of a pre-stage—DUT stage circuit sequence 700b and a pre-stage—DUT stage circuit sequence 700c.

FIG. 7a shows the first two stages of DFR RO circuit 700 comprising enable stage 702 and pre-stage 704. Each stage in DER RO circuit 700 includes an inverter circuit coupled between external circuitry including a pMOS transistor comprising a first power-gating transistor coupled to a voltage source 'V+', and an nMOS transistor comprising a second power-gating transistor coupled to ground. pMOS transistors also may be referred to as PFET (P Field Effect Transistor) devices, while nMOS transistors may also be referred to as NFET (N Field Effect Transistor) devices.

The external circuitry associated with enable stage 702 includes a pMOS transistor 701 and an nMOS transistor 707 (the first and second power-gating transistors), while the internal circuitry comprising the inverter circuit includes a pMOS transistor 703 and an nMOS transistor 705. The source (S) of pMOS transistor 701 is tied to voltage source 'V+', while the drain (D) of pMOS transistor 701 is coupled to the source of pMOS transistor 703. As shown in Table 900 of FIG. 9 below, the voltage level of voltage source V+ illustrated in the Figures herein can vary depending on the type of stress test being performed and/or the purpose of the circuitry to which V+ is used. The drain of pMOS transistor 703 is coupled to the drain of nMOS transistor 705 and the source of nMOS transistor 705 is coupled to the drain of nMOS transistor 707, whose source is tied to ground 709. Not enable RO terminal 712 is tied to the gate (G) of pMOS transistor 701 while enable RO terminal 714 is tied to the gate of nMOS transistor 707. Meanwhile, the gates of pMOS transistor 703 and nMOS transistor 705 are tied to RO feedback signal 766 on the input side of the inverter stage. The output of the inverter stage is coupled to the drains of pMOS transistor 703 and nMOS transistor 705.

During operation, the output of Not enable RO terminal 712 and enable RO terminal 714 will be selectively set or not set to affect a desired test configuration for the DFR RO. For example, during AC-Closed Loop RO operation the enable RO terminal is set to a logic "1" while the Not enable RO terminal to a logic "0" connecting the enable stage to power and ground thus enabling oscillations as the feedback loop is closed. In the DC-Static and AC-Open Loop RO operation mode the enable RO terminal is set to a logic "0" while the Not enable RO terminal to a logic "1" disconnecting the enable stage from power and ground and forcing the inverter chain into a logic state via Set static bias terminal 756 through the passgates controlled via RO enable 730 and RO not enable 716. pMOS transistor 701 and nMOS transistor 707 are labeled "Large Device" to indicate these pMOS and nMOS power-gating transistors are much larger and wider than internal pMOS transistor 703 and nMOS transistor 705. Preferably, pMOS transistor 701 and nMOS transistor 707 should be selected such that there is minimal voltage drop across these external power-gating devices.

Enable stage 702 operates as follows. The voltages at the header and footer control terminals are either ground (logic "0" or OFF) or a positive voltage that exceeds the gate threshold voltage of the nMOS devices (logic "1" or ON) and for pmos devices either the high side of the supply voltage (logic "0") or a positive voltage that is lower by the threshold voltage of the pmos devices (logic "1"). If not enable RO terminal 712 is set and enable RO terminal 714 is not set, the gate for pMOS transistor 701 will be activated, permitting current to flow across the transistor while the gate for nMOS transistor 707 will not be activated, which prevents current from flowing across nMOS transistor 707. This results in the voltage of the source of pMOS transistor 703 to be at (substantially) V+ (minimal voltage drop across this header device).

Now consider what happens when enable RO terminal 714 is ON and not enable RO terminal 712 is off. This activates the gate for nMOS transistor 707 while deactivating the gate for pMOS transistor 701. The result is the source of pMOS transistor 703 is left floating, while the source of nMOS transistor 705 is tied to ground 709 (effectively, since there will be minimal voltage drop across nMOS transistor 707). This couples the output of the enable stage signal 7661 to ground.

The next set of circuit elements comprise pass gates 770 and 772. Pass gate 770 is a dummy pass gate, while pass gate 772 is a functional pass gate; the reasons for including dummy pass gate 770 is for impedance and capacitance matching. The left-hand branches of this circuitry include pMOS transistors 711 and 713, while the right-hand branches include nMOS transistors 715 and 717. The gates of pMOS transistors 711 and 713 are tied to RO enable terminal 730, while the gates of nMOS transistors 715 and 717 are tied to RO not enable terminal 716. The input of pass gate 770 is left floating (with the result that it will be inoperative regardless of the input to the gates of pMOS transistor 711 and nMOS transistor 715), while the input of pass gate 772 is tied to set static bias 756.

By setting the logic levels of RO not enable terminal 716 and RO enable terminal 730, pass gate 772 can be activated or deactivated. Activation of pass gate 772 couples the set static bias input 756 to the output of the enable stage signal 7661, which enables a static bias for the output of the enable stage signal to be set using different static bias (voltage) values, as shown by signal 766$_{SB}$. Setting the Set static bias level to a logic "0" defines the input of the Pre-stage and thus yields a logic "1" at the output which forces the DUT stage into a PBTI/pMOS NCS stress mode. Setting the Set static bias level to a logic "1" defines the input of the Pre-stage and thus yields a logic "0" at the output which forces the DUT stage into a NBTI/nMOS NCS stress mode. Alternating the Set static bias level between logic "0" and logic "1" enables a dynamic (AC-Open Loop) stress mode at an arbitrary frequency typically below the AC-Closed Loop self-oscillating (resonant) frequency set by the device performance and design.

Next, circuitry 774 associated with pre-stage 704 is described. This includes the pre-stage 704 inverter circuit comprising internal pMOS transistor 721 and internal nMOS transistor 723, which is coupled between external power-gating devices comprising a pMOS transistor 719 and an nMOS transistor 725, which are large devices. As before, the source of pMOS transistor 719 is coupled to V+ while the source of nMOS transistor 725 is coupled to ground 727. RO not control terminal 718 is tied to the gate of pMOS transistor 719 while RO control terminal 732 is tied to the gate of nMOS transistor 725. Meanwhile, the gates of pMOS transistor 721 and nMOS transistor 723 are tied to the output of the enable stage signal 7661 on the input side of the inverter for pre-stage 704 and tied to the drains of pMOS transistor 721 and nMOS transistor 723 on the output side of the inverter.

The circuitry associated with pre-stage 704 may be configured by setting or not setting the logic inputs at RO not control terminal 718 and RO control terminal 722. In dynamic operation the pre-stage has the same logic functionality as the DUT stage and the enable stage which is to invert the logic signal. In the static or hybrid (DC-Static or AC-Open Loop) stress the functionality of the pre-stage is also to invert the logic signal in the inverter chain set by the Set static bias terminal 756. In the characterization mode the logic levels for RO control and RO not control disconnect the pre-stage from power and ground thus avoid the loading of the input terminal of the DUT stage.

The last set of circuitry in FIG. 7*a* includes a dummy pass gate 776 and a functional pass gate 778. The left-hand branches of this circuitry include pMOS transistors 729 and 731, while the right-hand branches include nMOS transistors 733 and 735. The input of pass gate 776 is floating, while gate force 758 is coupled to the input of pass gate 778. The gates of pMOS transistors 729 and 731 are tied to RO control terminal 734, while the gates of nMOS transistors 733 and 735 are tied to RO not control terminal 720.

FIG. 7*b* shows the first pre-stage—DUT stage inverter sub-chain 700*b*, which can be serially replicated in a DFR RO. The first two sets of circuit elements in FIG. 7*b* are the second pre-stage circuit elements (associated with pre-stage 704) in FIG. 7*a* discussed above. Circuity 780 associated with DUT stage 706 includes the DUT stage 706 inverter circuit comprising internal pMOS transistor 739 and internal nMOS transistor 741, which is coupled between external power-gating devices comprising a pMOS transistor 737 and an nMOS transistor 743, which are large devices. As before, the source of pMOS transistor 737 is coupled to V+ while the source of nMOS transistor 743 is coupled to ground 745. DUT header terminal 744 is tied to the gate of pMOS transistor 737 while DUT footer terminal 748 is tied to the gate of nMOS transistor 743. Meanwhile, the gates of pMOS transistor 739 and nMOS transistor 741 are tied to the output of the pre-stage signal 766$_2$ on the input side of the inverter for DUT stage 706 and tied to the drains of pMOS transistor 739 and nMOS transistor 741 on the output side of the inverter.

The last set of circuitry in FIG. 7*b* includes pass gates 782 and 784. The left-hand branches of this circuitry include pMOS transistors 747 and 749, while the right-hand branches include nMOS transistors 751 and 753. The input of pass gate 782 is tied to drain force 752, while the output of pass gate 784 is tied to drain sense 762. The gates of pMOS transistors 747 and 749 are tied to RO control terminal 736, while the gates of nMOS transistors 751 and 753 are tied to RO not control terminal 722.

The outputs of RO control terminal 734 and RO not control terminal 720 can be ON (or OFF) to selectively activate pass gate 778. Activation of pass gate 778 enables a gate force input to be provided at the input side of the inverter for DUT stage 706, as depicted by signal 766$_{GF}$. Similarly, the outputs of RO control terminal 736 and RO not control terminal 752 can be ON (or OFF) to selectively activate pass gates 782 and 784. Activation of pass gate 782 enables a drain force input to be coupled to the output of the DUT stage signal 766$_3$. Activation of pass gate 784 enables the output of the DUT stage signal 766$_3$ to be sensed at drain sense 762. As the output currents of the inverter are much larger than the input currents, a force/sense configuration is used to reduce voltage droop in the pass gates and thus yield more accurate nmos and pmos device characteristics.

DUT header 744 and DUT footer 748 are used to control whether current flows across pMOS transistor 737 and nMOS transistor 743. The separate control of DUT header and footer devices provides the opportunity to measure nmos and pmos transistor characteristics separately as only one of them will be connected to either power or ground at a time.

FIG. 7*c* shows the second instance of the pre-stage—DUT stage inverter sub-chain 700*c*. The circuit elements and configuration of pre-stage—DUT stage inverter sub-chains 700*b* and 700*c* are similar. Circuitry 786 associated with pre-stage 708 includes the pre-stage 708 inverter circuit comprising internal pMOS transistor 757 and internal nMOS transistor 759, which is coupled between external power-gating devices comprising a pMOS transistor 755 and an nMOS transistor 761, which are large devices. The source of pMOS transistor 755 is coupled to V+ while the source of nMOS transistor 761 is coupled to ground 763. RO not control terminal 724 is tied to the gate of pMOS transistor 755 while RO control terminal 738 is tied to the gate of nMOS transistor 761. Meanwhile, the gates of pMOS transistor 757 and nMOS transistor 759 are tied to the output of the DUT stage signal 766$_3$ on the input side of the inverter for pre-stage 708 and tied to the drains of pMOS transistor 757 and nMOS transistor 759 on the output side of the inverter.

The next circuit elements include a dummy pass gate 788 and a (functional) pass-gate 790. The left-hand branches of this circuitry include pMOS transistors 765 and 767, while the right-hand branches include nMOS transistors 769 and 771. The input of dummy pass gate 788 is floating, while gate force 760 is coupled to the input of pass gate 790. The gates of pMOS transistors 765 and 767 are tied to RO control terminal 740, while the gates of nMOS transistors 769 and 771 are tied to RO not control terminal 726. As before, selective activation of pass gate 790 enabled a gate force from gate force 760 to be coupled with the output of the pre-stage signal 766₄ prior to the input of the inverter for stage 710.

Circuity 792 associated with DUT stage 710 includes the DUT stage 710 inverter circuit comprising internal pMOS transistor 775 and internal nMOS transistor 777, which is coupled between external power-gating devices comprising a pMOS transistor 773 and an nMOS transistor 779, which are large devices. As before, the source of pMOS transistor 773 is coupled to V+ while the source of nMOS transistor 779 is coupled to ground 781. DUT header terminal 746 is tied to the gate of pMOS transistor 773 while DUT footer terminal 750 is tied to the gate of nMOS transistor 779. Meanwhile, the gates of pMOS transistor 775 and nMOS transistor 777 are tied to the output of the DUT stage signal 766₅ on the input side of the invertor for DUT stage 710 and tied to the drains of pMOS transistor 775 and nMOS transistor 777 on the output side of the inverter.

The final set of circuitry in FIG. 7c includes pass gates 794 and 796. The left-hand branches of this circuitry include pMOS transistors 783 and 785, while the right-hand branches include nMOS transistors 787 and 789. The input of pass gate 794 is tied to drain force 754, while the output of pass gate 796 is tied to drain sense 764. The gates of pMOS transistors 783 and 785 are tied to RO control terminal 742, while the gates of nMOS transistors 787 and 789 are tied to RO not control terminal 728.

The outputs of RO control terminal 740 and RO not control terminal 726 can be ON (or Of) to selectively activate pass gate 790. Activation of pass gate 790 enables a gate force input to be provided at the input side of the inverter for DUT stage 710. Similarly, the outputs of RO control terminal 742 and RO not control terminal 728 can be ON (or OFF) to selectively activate pass gates 794 and 796. Activation of pass gate 794 enables a drain force input to be coupled to the output of the DUT stage signal 766₅. Activation of pass gate 796 enables the output of the DUT stage signal 766₅ to be sensed at drain sense 764.

Figure 8:
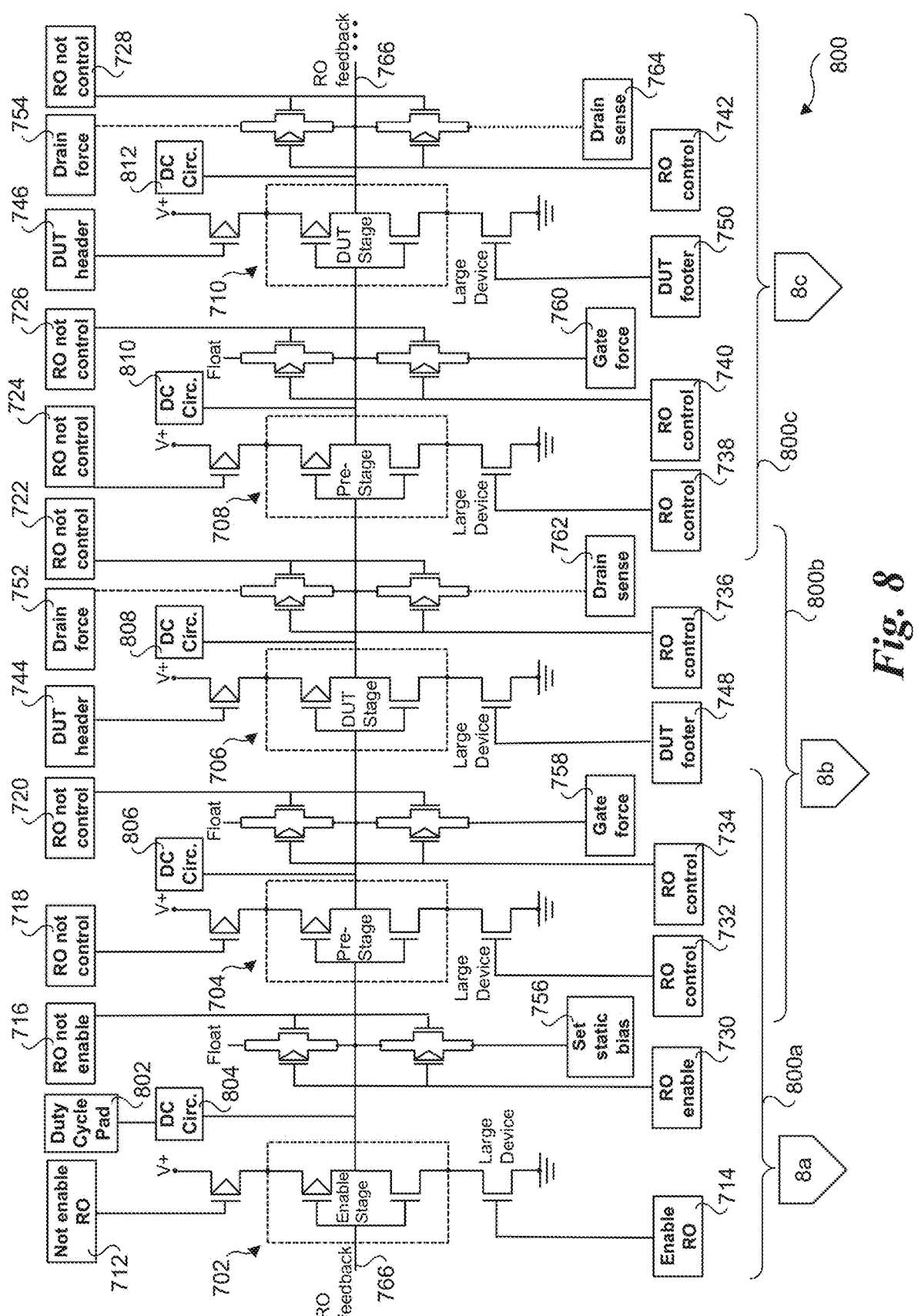
FIG. 8 shows a second example of a DFR RO circuit, according to one embodiment.
Figure 8A:
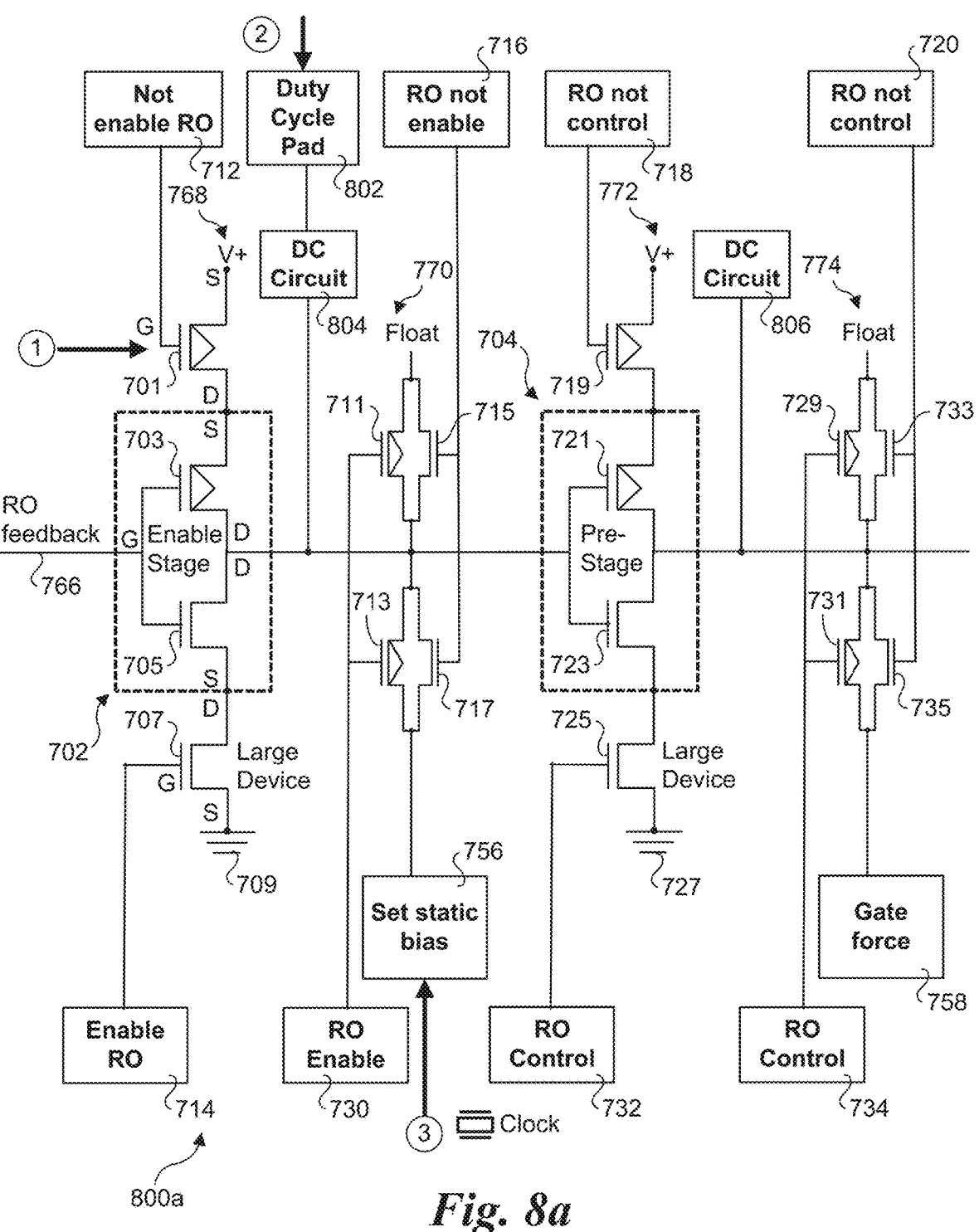
FIGS. 8a, 8b, and 8c show further details of the DFR RO circuit of FIG. 8.
Figure 8B:
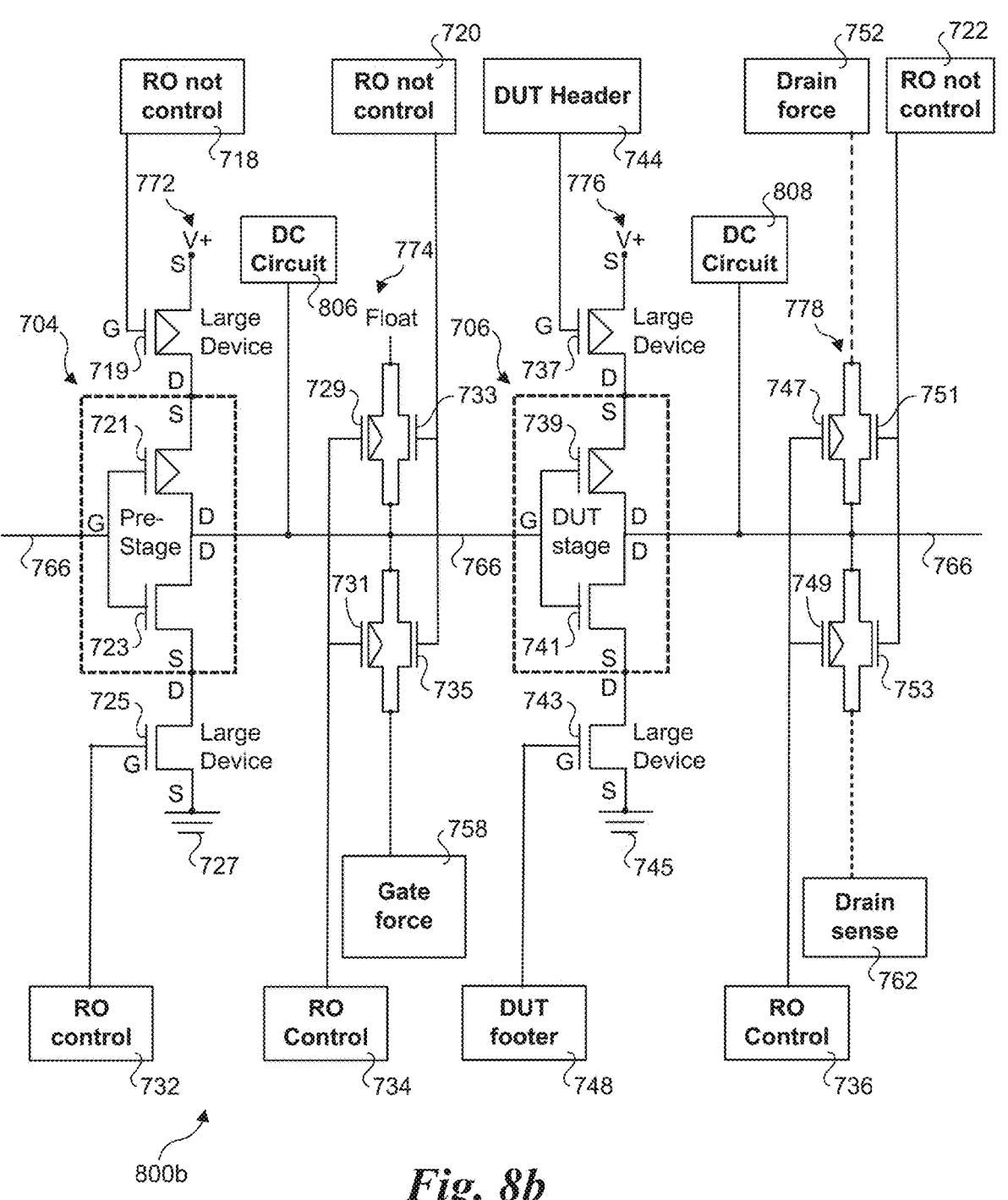
Figure 8C:
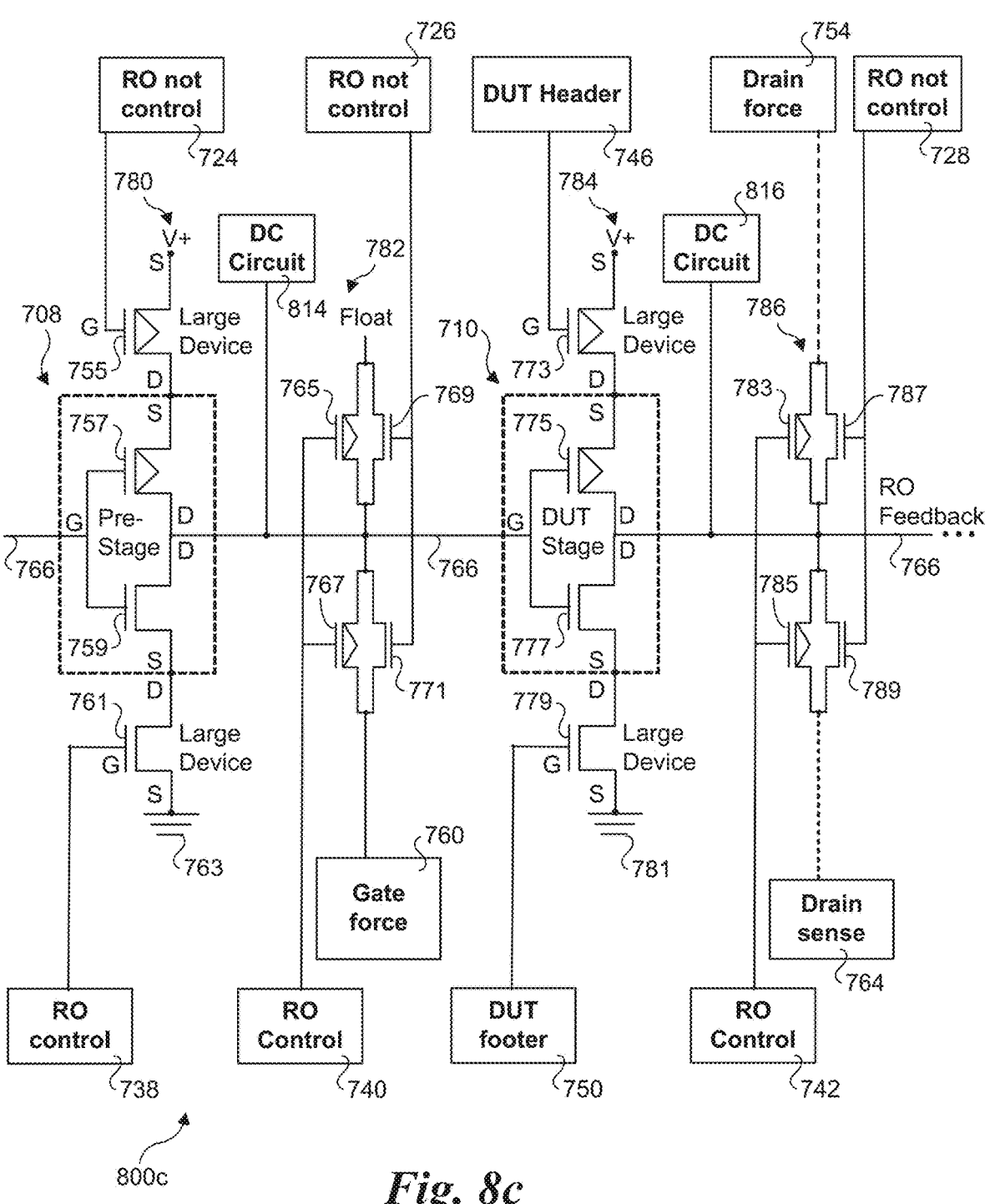

FIG. 8 shows a DFR RO circuit 800 that further adds a duty cycle pad 802 and DC (Duty Cycle, does not refer to Static in this usage of "DC") measure circuits 804, 806, 808, 810, and 812. Further details of this DFR RO circuit 800 are shown in FIGS. 8a, 8b, and 8c. FIG. 8a, which shows an inverter sub-chain 800a including enable stage and first pre-stage 800a of DFR RO circuit 800 is annotated with three qualities and functions for DFR RO circuit 800. As depicted at the arrow with an encircled '1', impedance matching is applied to all RO stages. This means, for example, the impedance of the power-gating transistors for each stage match, as do the impedance of the internal transistors that form the inverter for a given stage.

Second, as depicted by the arrow with an encircled '2', DFR RO circuit 800 is an in situ circuit that can infer the duty cycle at t=0 and after Aging. A simple implementation of a duty cycle circuit is the use of an inverter to charge/ discharge an RC element (in, for example a low-pass filter configuration) where the time constant tau is set to the RxC and is set to be much larger than the period of the oscillator frequency. The Duty cycle pad voltage terminal is connected between resistor and capacitor. A 2nd implementation of a DC duty cycle circuit consists of a sub-circuit that generates matching Iup and Idown currents. The input of the DC duty cycle circuit turns on Iup when above a specific threshold voltage and turns on Idown when below a specific threshold voltage. The resultant voltage at the output of the DC duty cycle circuit reflects the amount of time the Input signal was above the threshold voltage and the amount of time below the threshold voltage. For example, if the Output voltage equals the threshold voltage it can be said that the duty cycle is 50%. If the output voltage is 10% higher than the threshold voltage, it can be said that the DC duty cycle Input signal spends 60% of its time above the threshold voltage and only 40% of its time below the threshold voltage.

Third, as depicted by the arrow with an encircled '3', an external clock 814 may be selectively used in the hybrid (DC-Static or AC-Open Loop) mode to study 0 Hz and up to frequencies close to AC-Closed Loop frequencies.

FIG. 8b shows an inverter sub-chain 800b comprising pre-stage 704 and DUT stage 706. FIG. 8c shows an inverter sub-chain 800c comprising pre-stage 708 and DUT stage 710. Each input of the DC circuits 806, 808, 810, and 812 is connected to RO feedback signal 766. While circuit details between circuits 804 circuits 806, 808, 810, and 812 may differ, input impedance and capacitance are the same to maintain impedance and capacitance matching along the chain.

DER RO circuits 700 and 800 provide the following additional capabilities:

The ability to quantify the effects of noise on each Aging mechanism

The ability to quantify the effects of each Aging mechanism on frequency

The ability to independently control the RO charge up current and charge down current Additionally, through the use of external power supplies, a dedicated RO power supply may be used for the DFO RO circuits 700 and 800, while a dedicated periphery circuit power supply may be used to power peripheral circuitry.

Generally, the pMOS and nMOS device sizes for the pMOS and nMOS transistors described above are chosen to match all the other stages of the RO. This results in the exact matching of every stage of the RO. Note that the power-gating transistors have a very large width in order to ensure as small of a voltage drop across them as possible, and to ensure the largest possible $V_{DS}$ is applied to the internal pMOS and nMOS devices. This allows for a more accurate study of the much smaller internal pMOS and nMOS devices. The power-gating pMOS and nMOS devices simply reconfigure the RO as an oscillator and alternatively act as a pathway to measure the I/V characteristics of the much smaller internal pMOS and nMOS devices before stressing (T=0) and after DC-Static, Hybrid, and AC/Dynamic/Transient stressing. The internal pMOS and nMOS devices are the subject of the aging study and not the much larger power-gating pMOS and nMOS devices. The goal of this structure is to measure the frequency change of the RO due to aging and then to break the oscillation loop and measure the I/V characteristics, and then to ultimately correlate the AC frequency degradation and the DC I/V degradation due to transistor aging. The DFR RO circuitry may be configured to study various Aging phenomena such as CHC, NBTI, PBTI, NCS, . . . as the aging phenomena applies to both the pMOS and nMOS devices. Additionally, the DFO RO circuit structure also allows the study of Aging phenomena while sweeping frequency from 0 hertz (DC) up to the 21-stage RO frequency of ~100 Mhz and then up to max frequency of a 3-stage RO (~2.5 Ghz) for a conventional CMOS process with gate lengths of approximately 100 nm.

FIG. 9 shows table 900 depicting various optimized DFR-RO stress and sense control settings that may be used with DFR-RO circuit 700, according to one embodiment. The values and/or settings for V+, RO control, RO not control, DUT header, DUT footer, Enable RO, and Not Enable RO, and Set static bias may be configured, as shown in table 900 to implemented different test modes. These include dynamic RO stress, static RO stress, RO sense, NFET (nMOS transistor) sense, and PFET (pMOS transistor sense).

RO control, RO not control, DUT header and DUT footer, enable RO and not-enable RO signal control connectivity to power/GND and pass gates to drive the NFET/PFET devices. In FET sense mode, the drain is biased via force/sense line to compensate IR drop.

Figure 10:
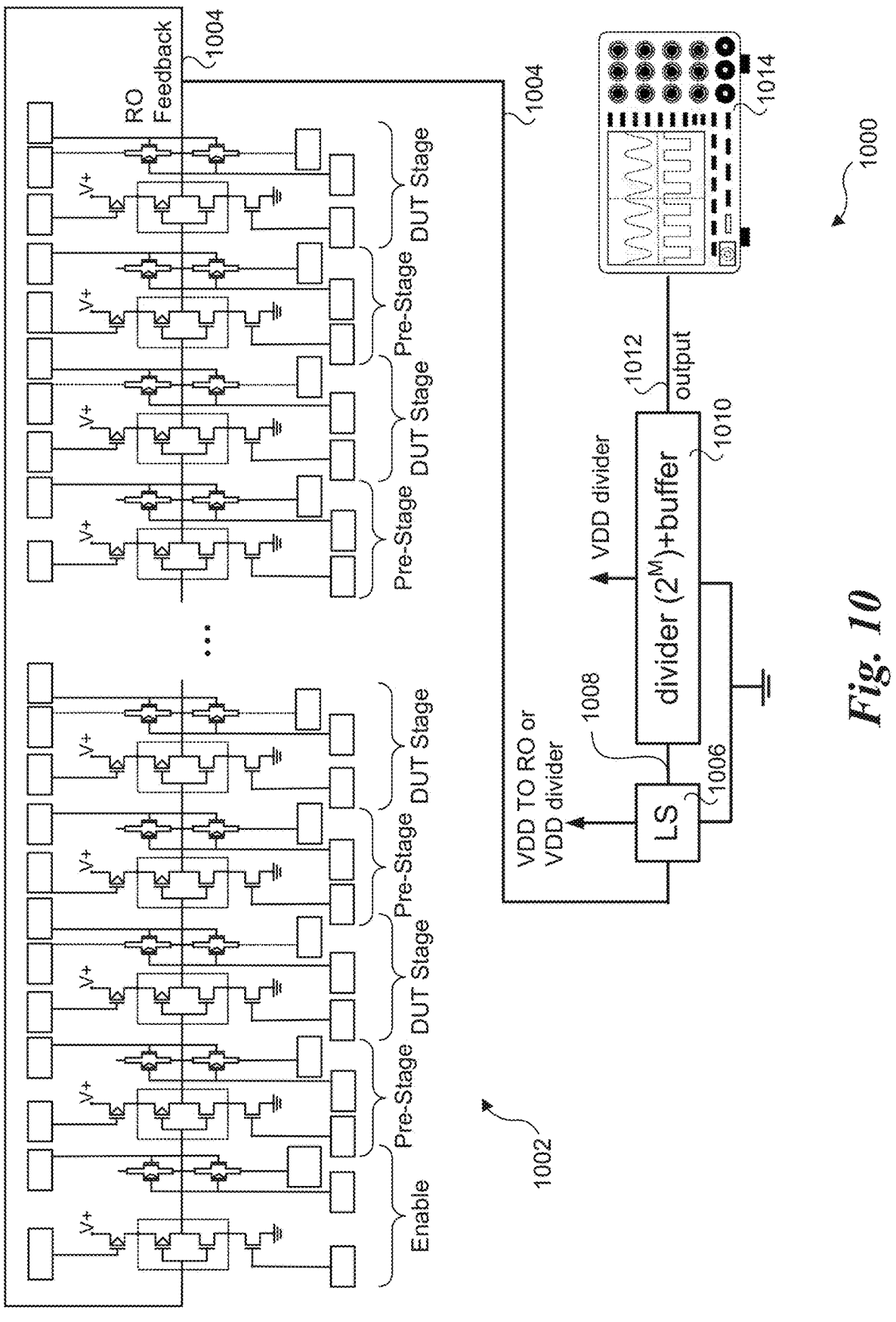
FIG. 10 shows a test configuration for performing frequency testing using a DFR RO for a CMOS device including thick oxide pMOS and nMOS transistors, according to one embodiment.

FIG. 10 shows an in situ test configuration 1000 for performing frequency testing, according to one embodiment. Generally, the DFR RO circuit 1002 may comprise N stages where N is odd. The stages will begin with an enable stage, followed by one or more pairs of pre-stage—DUT stage, as shown in FIG. 10 and illustrated above. When there is an odd number of chained invertors that are all powered (the power-gating pMOS and nMOS devices are activated), a DFR RO circuit will produce an oscillating RO feedback signal 1004. This may be used for frequency testing of the pMOS and nMOS inverter chain.

The example in situ test configuration 1000 is for thick oxide testing. As shown, RO feedback signal 1004 is passed to an LS 1006, with the level-shifted output 1008 fed into divider+buffer 1010. The divided output 1012 is then sampled with electronic measurement equipment (such as an oscilloscope 1014). SMUs (not separately shown) are used to provide the control inputs and signals to DFO RO circuit 1002 to activate the power-gating pMOS and nMOS devices and perform other configuration operations.

In summary, embodiments of the DFO RO may be configured to have the following attributes/features/capabilities/modes:

AC-Closed Loop Mode:
  a. The ability to study frequency and in situ duty cycle in traditional RO transient (AC closed-loop natural frequency) operation/mode
  b. The ability to study the effects of noise (frequency and amplitude) both internally generated and externally applied
  c. The ability to study frequency domain cause and effect relationships
  d. The ability to infer the duty cycle as seen in the RO loop using the methods of:
    i. Voltage averaging
    ii. Integration of charge over time (the comparing over time of Iup and Idown)
DC-Static Mode:
  e. The ability to study the RO in a static (DC) mode
    i. Allows for the study of both pMOS and nMOS IV characteristics using a very low current (Sense) method to more accurately measure voltage
    ii. The ability to break the RO loop for use during DC measurements while not altering the AC matching of all RO stages
Hybrid Mode:
  f. The ability to study the RO in a hybrid AC-Open Loop and DC-Static mode
    i. Allows for the study of both pMOS and nMOS zero Hz and low frequency phenomena Structural:
  g. Independent control of both the charge up and charge down current supplied to each RO stage which allows for the control of frequency and rise/fall times
  h. One power supply (vcc) dedicated to the RO and a $2^{nd}$ power supply (vccp) dedicated to the support/periphery circuitry used for measuring the RO and its constituent characteristics in the AC-Closed Loop, AC-Open Loop, DC-Static, and Hybrid modes
  i. The ability to set vcc independent of vccp which allows for;
    i. The powering down of the periphery circuitry while the RO is being operated in the traditional transient (AC-Closed-Loop) mode
    ii. Control of the voltage (threshold) at which the duty cycle is determined Thus, to summarize the above teachings, the design for reliability ring oscillator circuit is capable of administering a number of different static, dynamic and reduced frequency input stimulus ("hybrid") measurements that can provide insight into the degradation of the ring oscillator's transistors. Specifically:

i) Individual Transistor IV Characteristics (Static)

Figure 11:
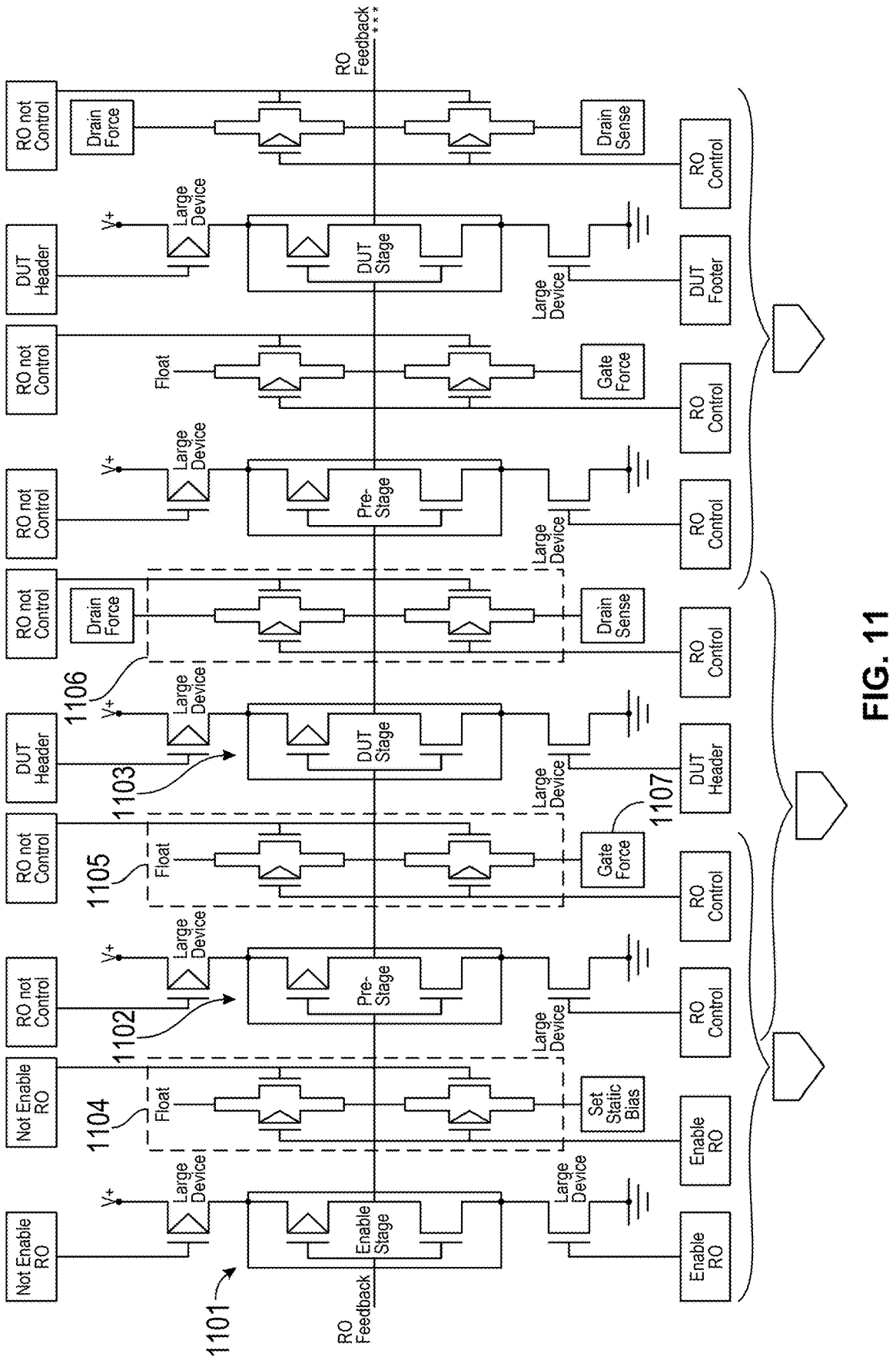
FIG. 11 re-presents the circuit of FIG. 7.

Here, gate bias and drain/source bias can be individually applied to a PMOS transistor or an NMOS transistor within a DUT stage. Referring to FIG. 11, which is FIG. 7 but with additional/different reference numbers, in order to isolate either the PMOS transistor or the NMOS transistor within the DUT stage inverter 1103, the inverters 1101, 1102 within the enable stage and pre stage are disabled while the pass gate 1105 in the pre stage is enabled (enable_RO= RO_control=LO, while Not_enable_RO=RO_not_control= HI).

Notably, with respect to FIG. 7 (as well as FIGS. 7a, 8, 8a), the "Not enable RO" node 712 and the "RO not enable" node 716 are the same node (they are tied together). Similarly, the "enable RO" node 714 and the "RO enable" node 730 are the same node (they are tied together). For this reason, FIG. 11 has opted to name the "not enable" nodes with the same name ("Not_enable_RO") and name the "enable" nodes with the same node ("Enable_RO").

With the pass gate 1105 of the pre stage in pass thru mode, a gate bias is applied to the input of the inverter 1103 within the DUT stage through the Gate_force node 1107. By setting DUT_footer=HI and DUT_header=HI, the NMOS transistor within the DUT stage inverter 1103 is activated for IV characterization while the PMOS transistor within the DUT stage inverter 1103 is disabled. Note that is particular configuration corresponds to the "NFET Sense" column in FIG. 9.

By contrast, by setting DUT_footer=LO and DUT_header=LO, the PMOS transistor within the DUT stage inverter 1103 is activated for IV characterization while the NMOS transistor within the DUT stage inverter 1103 is disabled. In either scenario, drain bias is provided to the transistor being characterized by applying the drain bias at the Drain_force node and measuring the drain-source current through the Drain_force node. With this arrangement, drain biases can be swept for a same gate bias (as applied from the Gate_force node) across a sweep of gate biases. Measuring drain-source current for each unique combination of gate bias and drain bias will yield a complete IV characteristic for the particular transistor being measured. Note that is particular configuration corresponds to the "PFET Sense" column in FIG. 9.

ii) Ring Oscillator Characterization (Dynamic)

The frequency of the ring oscillator's oscillation can be measured to infer degradation of the inverter 1101, 1102,

1103 transistors under stress (for ease of drawing the respective inverters of only the first instances of the enable, pre and DUT stages are labeled with a reference number). A first characterization ("RO Sense" column in FIG. 9) measures the ring oscillator's "nominal" or "baseline" frequency of oscillation when the inverter supply voltage V+ is set to a nominal supply voltage setting ("VDDnom" in FIG. 9). Once the nominal/baseline frequency of oscillation is characterized, the inverter supply voltage V+ is changed to a higher voltage ("Vstress" in FIG. 9) and the ring oscillator operates for a period of time ("RO Stress dynamic" column in FIG. 9) before reducing the supply voltage back to a nominal supply voltage setting ("VDDnom" in FIG. 9) and measuring the frequency again. Change in oscillation frequency from nominal/baseline oscillation prior to stress demonstrates degradation of the inverter transistors under stress.

iii) Reduced Frequency Input Stimulus ("RO Stress Static" Column in FIG. 9)

As described above, an externally supplied stimulus signal can be injected into the circuit through the Set_static_bias input of the pre stage. The frequency of the externally supplied input stimulus signal is typically less than the natural oscillation frequency of the ring oscillator in dynamic mode (e.g., the natural oscillation frequency of the ring oscillator in dynamic mode is in the GHz range while the frequency of the input stimulus in RO Stress static mode (also referred to as "hybrid" mode) is typically less than 100 MHz). The reduced frequency input stimulus can be used to exert a number of different stress/degradation mechanisms upon the transistors in the DUT stage inverter 1103 as described at length immediately below.

As depicted in FIGS. 12a through 12d (which revisit the subject matter of the discussion of FIGS. 1 and 2), three different types of degradation can be induced within an inverter's transistors depending on how the transistors are biased: bias temperature instability (BTI), non-conducting stress (NCS) and channel hot carrier (CHC). As summarized immediately below, BTI is induced by applying little/no stress bias across a transistor's channel when the transistor is ON, NCS is induced by applying a nominal/stress bias across a transistor's channel when the transistor is OFF, and CHC is induced by switching the transistor between ON and OFF states.

With respect to BTI, referring to FIG. 12a, positive BTI (PBTI) is induced in an NMOS transistor when the drain-to-source voltage is negligible (e.g., 0 V) and the gate node bias is above the source node bias by at least the threshold amount (the NMOS transistor is ON). By contrast, negative BTI (NBTI) is induced in a PMOS transistor when the source-to-drain voltage is negligible (e.g., 0 V) and the gate node bias is beneath the source node bias by at least the threshold amount (the PMOS transistor is ON).

With respect to NCS, referring to FIG. 12b, NCS is induced in an NMOS transistor when the transistor is OFF (the gate voltage is less than the threshold above the source node) and a nominal or stress drain-to-source voltage is applied across the transistor's channel. By contrast, NCS is induced in a PMOS transistor when the transistor is OFF (the gate voltage is less than the threshold beneath the source node) and a nominal or stress source-to-drain voltage is applied across the transistor's channel.

With respect to CHC, referring to FIG. 12c, CHC is induced by switching the transistor back-and-forth between the BTI and NCS inducing states described just above. That is, CHC is induced by switching a transistor back-and-forth between a first state in which the transistor is ON and has negligible bias across its channel and a second state in which the transistor if OFF and has a nominal/stress bias across its channel.

As described above, and referring to FIG. 12d, all three of these degradation mechanisms can be induced upon both the NMOS and PMOS transistors within the RO circuit's DUT stage by the application of static/hybrid waveform through the RO circuit's Set_static_bias node. According to this test mode ("RO stress static" column in FIG. 9), Enable_RO is set LO and Not_enable_RO is set HI to disable the inverter 1101 but enable the pass gate 1104 in the enable stage. Additionally, RO_control is set HI and RO_not_control is set LO to enable the inverter 1102 and disable the pass gate 1105 within the pre stage (disabling the pass gate 1105 in the pre stage causes the output of the inverter 1102 within the pre stage to be driven directly to the input of the inverter 1103 within the DUT stage).

Under this configuration, a waveform is applied to the Set_static_bias node. The waveform passes through the enabled pass gate 1104 in the enable stage and is applied to the input of the inverter 1102 within the pre stage. The inverter 1102 in the pre stage inverts the waveform and the inverted waveform is sent to the input of the inverter 1103 within the DUT stage. The inverter 1103 in the DUT stage is also enabled with DUT_footer=Vstress and DUT_header=GND.

FIG. 12d depicts an example of the inverted Set_static_bias waveform ("Vin") that is applied to the inverter 1103 in the DUT stage. Note that the Vin waveform inverter induces BTI, NCS and CHC to both the PMOS transistor and the NMOS transistor within the DUT stage inverter 1103 as described above.

Specifically, as observed in FIG. 12d, the Vin waveform can be viewed as exerting four different phases of degradation to the DUT inverter's NMOS and PMOS transistors as follows:

Phase 1: PBTI is exerted upon the NMOS transistor and NCS is exerted upon the PMOS transistor (NMOS transistor is ON with negligible VDS voltage across the NMOS channel (NMOS is pulling DUT inverter output ("Vout") to ground)); PMOS transistor is OFF with stress voltage (Vstress) being applied across the PMOS channel.

Phase 2: CHC is exerted upon both the NMOS and PMOS transistors (the NMOS transistor is switching from ON to OFF and the PMOS transistor is switching from OFF to ON).

Phase 3: NBTI is exerted upon the PMOS transistor and NCS is exerted upon the NMOS transistor (PMOS transistor is ON with negligible VDS voltage across the PMOS channel (PMOS is pulling DUT inverter output to Vstress)); NMOS transistor is OFF with nominal/stress voltage (Vstress) being applied across the NMOS channel.

Phase 4: CHC is exerted upon both the NMOS and PMOS transistors (the PMOS transistor is switching from ON to OFF and the NMOS transistor is switching from OFF to ON).

The four phases then continually repeat with each cycle of the waveform.

Notably, the output voltage of the DUT inverter (Vout) is driven by the activity of the inverter's NMOS and PMOS transistors. The discussion of FIGS. 2a and 2b, by contrast, pertain to a special "inverted" test mode in which the input waveform that is applied to the gate of a transistors under stress is inverted, phase delayed and then directly applied ("forced") upon the drain of the transistor to effect a specific Vx/Vstress crossover during switching.

This particular test mode is not supported in the RO Stress static mode because the DUT stage's pass gate 1106 (like the pre stage's pass gate 1105) is disabled (the state of both pass gates 1105, 1106 are controlled by the same input signals RO_control and RO_not_control). As such, the Drain_force node cannot be used to force the aforementioned inverted and delayed input waveform upon the tied drains of the DUT inverter's transistors.

In an alternative embodiment, however, the RO_control and RO_not_control inputs are split into separate, dedicated and isolated inputs for the pre stage and the DUT stage respectively (e.g., RO_prestage_control, RO_prestage_not_control, RO_DUTstage_control and RO_DUTstage_not_control). By so doing, the circuit can support an "inverted" RO Stress static mode which corresponds to the RO stress static mode described at length above, but where, the DUT stage pass gate 1106 is enabled to allow a signal that corresponds to the inverted and delayed DUT inverter 1103 input signal to be applied to the Drain_force node so that it is exerted upon the DUT stage inverter 1103 output. Circuitry can be added to the circuit of FIG. 7 that inverts and delays the output of the pre stage pass gate 1105 and applies the resulting signal to the Drain_force node to implement the inverted RO stress static mode. The delay can be programmable to effect different Vx/Vstress settings.

3.0 Improved Design for Reliability (DFR) Ring Oscillator (RO) Circuit

Figure 13:
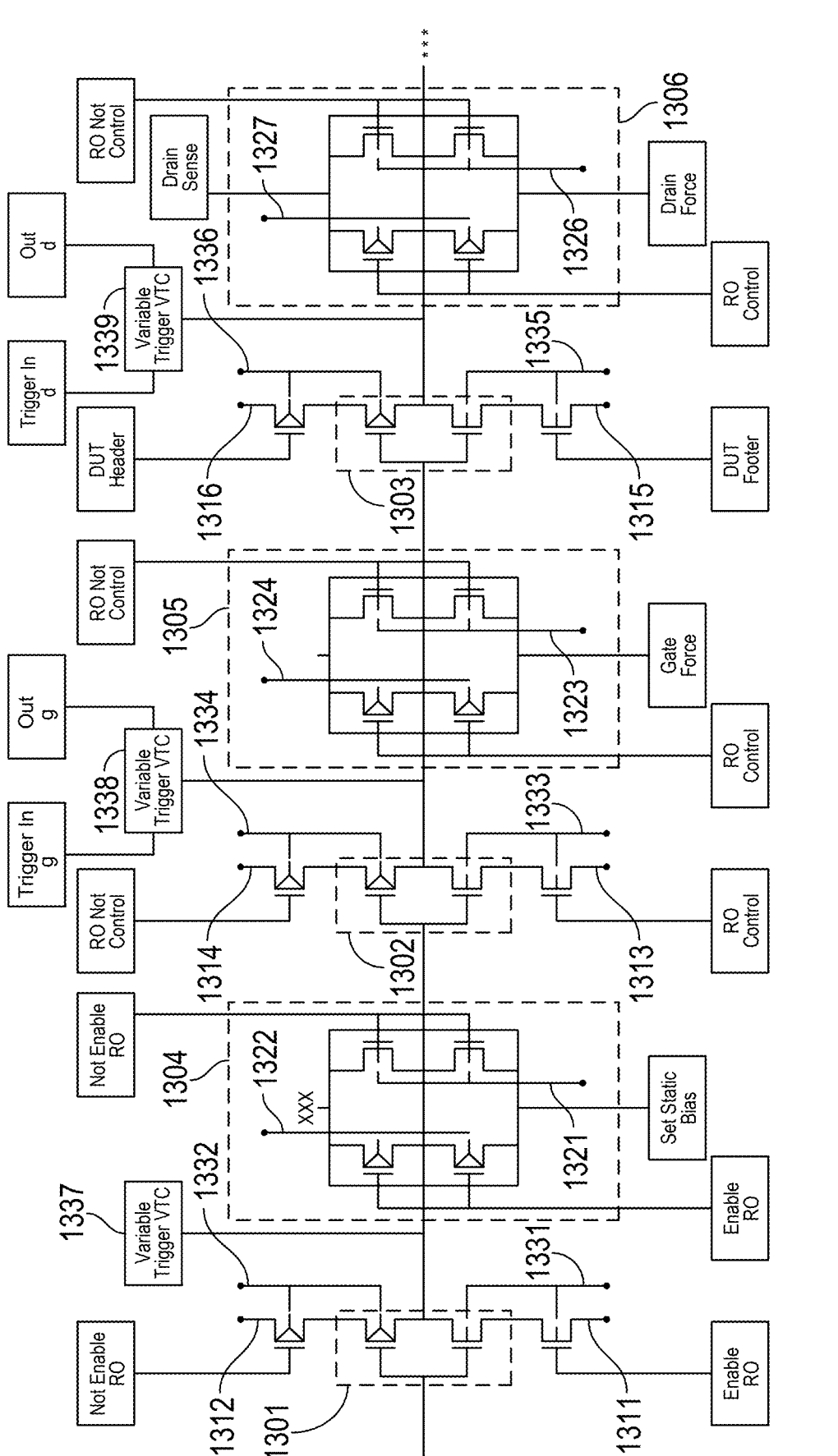
FIG. 13 shows an improved RO circuit.

FIG. 13 depicts another DFR-RO circuit that can implement any/all of the above described test modes but has been modified relative to the circuits of FIGS. 7 and 11 to exhibit even more testing functionality. In particular, the enable stage, pre stage and DUT stage have their own separate, isolated and dedicated supply rails 1311 ("Vss_en"), 1312 ("Vdd_en"), 1313 ("Vss_g"), 1314 ("Vdd_g"), 1315 ("Vss_d"), 1316 ("Vdd_d") for each of their respective inverters 1301, 1302, 1303 (for ease of discussion an RO having only a single enable, pre and DUT stage is depicted, the respective stages of longer chain ROs would be similarly designed).

Designing the different stages to have their own dedicated supply rails, particularly with respect to the pre stage and DUT stage, allows the NMOS and PMOS transistors within the DUT inverter 1303 to be further stressed, as described in more detail below, according to any of the following: 1) Gate Overdrive; 2) Gate Underdrive; 3) Drain Overdrive; and, 4) Drain Underdrive. The gate overdrive, gate underdrive (with concurrent sub threshold stress or without concurrent sub threshold stress), drain overdrive and drain underdrive test conditions can be applied when the circuit is in dynamic mode or in RO Stress static mode.

Moreover, each stage of the circuit of FIG. 13 has its own integrated programmable voltage-to-time converter 1331, 1332, 1333 (e.g., as a replacement for the duty cycle circuits discussed above with respect to FIGS. 8, 8a, 8b, 8c) to provide more detailed information concerning the waveform between the inverter and pass gate within the stage. Here, for example, as the resonant frequency of the ring oscillator increases (e.g., with decreasing transistor gate length for more advanced manufacturing technologies, etc.), the internal waveform within the ring oscillator can resemble a sinusoidal signal than a digital signal. The voltage-to-time converters 1331, 1332, 1333 provide better characterizing capability of such a sinusoidal or near sinusoidal signal better than a duty cycle circuit (e.g., characterizing amplitude).

Each of these features are described in more detail immediately below. FIGS. 14a and 14b provide configuration possibilities of the improved circuit of FIG. 13.

i) Gate Overdrive

To overdrive the gate of the DUT inverter's NMOS transistor an elevated stress voltage (Vstress+Δ) is applied to the VDD supply rail 1314 of the pre stage inverter 1302. Here, the output of the pre stage inverter 1302 rises to Vstress+Δ when driven HI. This Vstress+Δ voltage level is then applied to the gate of (and thereby applies stress to) the DUT inverter's NMOS transistor. By contrast, to overdrive the gate of the DUT inverter's PMOS transistor, an elevated stress voltage (GND−Δ) is applied to the VSS supply rail 1313 of the pre stage. Here, when the output of the pre stage inverter 1302 is driven LO, it is driven to GND−Δ which is then applied to the gate of (and thereby applies stress to) the DUT inverter's PMOS transistor.

Depending on the desired test conditions the gates of both the NMOS and PMOS transistors within the DUT inverter 1303 can be overdriven (by simultaneously applying Vstress+Δ and GND−Δ to the pre stage inverter's VDD and VSS supply rails 1314, 1313, respectively), or, only one of these transistors is overdriven (e.g., only the NMOS gate is overdriven by applying Vstress+Δ and GND to the pre stage inverter's VDD and VSS supply rails 1314, 1313, respectively; or, only the PMOS gate is overdriven by applying Vstress and GND−Δ to the pre stage inverter's VDD and VSS supply rails 1314, 1313, respectively). Again, the gate overdrive conditions can be applied when the circuit is in the RO Stress Static mode 1402, 1405 and the dynamic mode 1412, 1415.

ii) Gate Underdrive

To underdrive the gate of the DUT inverter's NMOS transistor a reduced stress voltage (Vstress−Δ) is applied to the VDD supply rail 1314 of the pre stage inverter 1302. Here, the output of the pre stage inverter 1302 rises only to Vstress−Δ when driven HI. This Vstress−Δ voltage level is then applied to the gate of the DUT inverter's NMOS transistor. This, in turn, causes the NMOS transistor to drive the output of the DUT inverter 1303 LO with less current pull than in the nominal (Vstress) or overdrive (Vstress+Δ) states.

By contrast, to underdrive the gate of the DUT inverter's PMOS transistor, a reduced stress voltage (GND+Δ) is applied to the VSS supply rail 1313 of the pre stage inverter 1302. Here, the output of the pre stage inverter 1302 is driven to GND+Δ when driven LO which is then applied to the gate of the DUT inverter's PMOS transistor. This, in turn, causes the PMOS transistor to drive the output of the DUT inverter HI with less current pull than in the nominal (Vstress) or overdrive (GND−Δ) states. The gate underdrive conditions can be applied when the circuit is in the RO Stress Static mode 1403, 1404, 1406, 1407 and the dynamic mode 1413, 1414, 1416, 1417.

In technologies that do not have separate biasing of the p-well for NMOS transistors or the n-well for PMOS transistors, under-driving the gate as described just above also exerts sub threshold NCS to the "other" transistor in the DUT inverter whose gate is being under-driven 1403, 1406, 1413, 1416. That is, if the gate of the NMOS transistor in the DUT inverter 1303 is being under-driven, sub threshold NCS stress is exerted upon the PMOS transistor in the DUT inverter 1303. Likewise, if the gate of the PMOS transistor in the DUT inverter 1303 is being under-driven, sub threshold NCS stress is exerted upon the NMOS transistor in the DUT inverter 1303.

Sub-threshold NCS can occur when a transistor is only "weakly" OFF. Thus, when the gate of the NMOS transistor in the DUT inverter 1303 is being under-driven and a voltage of only Vstress−Δ is applied to the PMOS transistor in the DUT inverter 1303, the PMOS transistor is only weakly off. That is, the source-to-gate potential of the PMOS transistor is non-zero (in which case the PMOS transistor is only weakly OFF) whereas, when the gate of the NMOS transistor is not being under-driven, the source-to-gate potential of the transistor is zero (in which case the PMOS transistor is strongly OFF).

Similarly, when the gate of the PMOS transistor in the DUT inverter 1303 is being under-driven and a voltage of only GND+Δ is applied to the NMOS transistor in the DUT inverter 1303, the NMOS transistor is only weakly off. That is, the gate-to-source potential of the NMOS transistor is non-zero (in which case the NMOS transistor is only weakly OFF) whereas, when the gate of the NMOS transistor is not being under-driven, the gate-to-source potential of the transistor is zero (in which case the NMOS transistor is strongly OFF).

In technologies that have separate biasing of the p-well for NMOS transistors 1331, 1321, 1333, 1323, 1335, 1326, and/or the n-well for PMOS transistors 1332, 1322, 1334, 1324, 1336, 1327, the well potentials can be adjusted to adjust transistor source voltage and remove the "weakly" OFF state in the "other" transistor. That is, when the NMOS transistor is being under-driven, the n-well 1336 of the PMOS transistor in the DUT inverter 1303 can be lowered to Vstress−Δ to effectively cause the source-to-gate potential of the PMOS transistor to be effectively zero (in which case the PMOS transistor is strongly "OFF"). Similarly, when the PMOS transistor is being under-driven, the p-well 1335 of the NMOS transistor in the DUT inverter 1303 can be raised to GND+Δ to effectively cause the gate-to-source potential of the NMOS transistor to be effectively zero (in which case the NMOS transistor is strongly "OFF").

iii) Drain Overdrive

To effect drain overdrive the drain potential of a transistor within the DUT inverter 1303 is biased to expand the potential across the transistor channel when the transistor is first turned ON. Specifically, to drain overdrive the NMOS transistor in the DUT inverter 1303, the VDD supply rail 1316 is set to Vstress+Δ so that the PMOS transistor drives the inverter output to Vstress+Δ when the PMOS transistor is ON. When the inverter switches from this state to the PMOS OFF and NMOS ON state, the NMOS drain will observe a voltage of Vstress+Δ when it first turns ON thereby effecting drain overdrive to the NMOS transistor. NMOS drain overdrive can be performed in both the RO Stress Static mode 1408 and the dynamic mode 1418.

To drain overdrive the PMOS transistor in the DUT inverter 1303, the VSS supply rail 1315 is set to GND−Δ so that the NMOS transistor drives the inverter output to GND−Δ when the NMOS transistor is ON. When the inverter switches from this state to the NMOS OFF and PMOS ON state, the PMOS drain will observe a voltage of GND−Δ when it first turns ON (which corresponds to a Vstress+Δ source-to-drain voltage) thereby effecting drain overdrive to the PMOS transistor. PMOS drain overdrive can be performed in both the RO Stress Static mode 1410 and the dynamic mode 1420.

iv) Drain Underdrive

To effect drain underdrive the drain potential of a transistor within the DUT inverter 1303 is reduced across the transistor channel when the transistor is first turned ON. Specifically, to drain underdrive the NMOS transistor in the DUT inverter 1303, the VDD supply rail 1316 is set to Vstress−Δ so that the PMOS transistor drives the inverter output to Vstress−Δ when the PMOS transistor is ON. When the inverter switches from this state to the PMOS OFF and NMOS ON state, the NMOS drain will observe a voltage of Vstress−Δ when it first turns ON thereby effecting drain underdrive to the NMOS transistor. NMOS drain underdrive can be performed in both the RO Stress Static mode 1409 and the dynamic mode 1419.

To drain underdrive the PMOS transistor in the DUT inverter 1303, the VSS supply rail 1315 is set to GND+Δ so that the NMOS transistor drives the inverter output to GND+Δ when the NMOS transistor is ON. When the inverter switches from this state to the NMOS OFF and PMOS ON state, the PMOS drain will observe a voltage of GND+Δ when it first turns ON (which corresponds to a Vstress−Δ source-to-drain voltage) thereby effecting drain underdrive to the PMOS transistor. PMOS drain underdrive can be performed in both the RO Stress Static mode 1411 and the dynamic mode 1421.

v) Voltage-to-Time Converters

Each stage of the circuit of FIG. 13 has an integrated programmable voltage-to-time converter 1337, 1338, 1339 to provide more detailed information concerning the waveform within the stage. Here, as described above, as the resonant frequency of the ring oscillator increases (e.g., with decreasing transistor gate length for more advanced manufacturing technologies) and number of stages in the chain being reduced to as low as 3-stage, the internal waveform within the ring oscillator can resemble more of a sinusoidal signal than a digital signal.

The emergence of a sinusoidal signal rather than a digital signal as the frequency of oscillation increases is a result of the ring oscillator's bandwidth not being high enough to pass the extremely high frequencies that shape a digital signal's rise and fall times. The loss of these signal components can also cause the peak-to-peak amplitude of the signal to fall to something less than the full VDD-VSS peak-to-peak amplitude that the duty cycle circuits of FIGS. 8, 8a, 8b, and 8c are designed to process.

Figure 15:
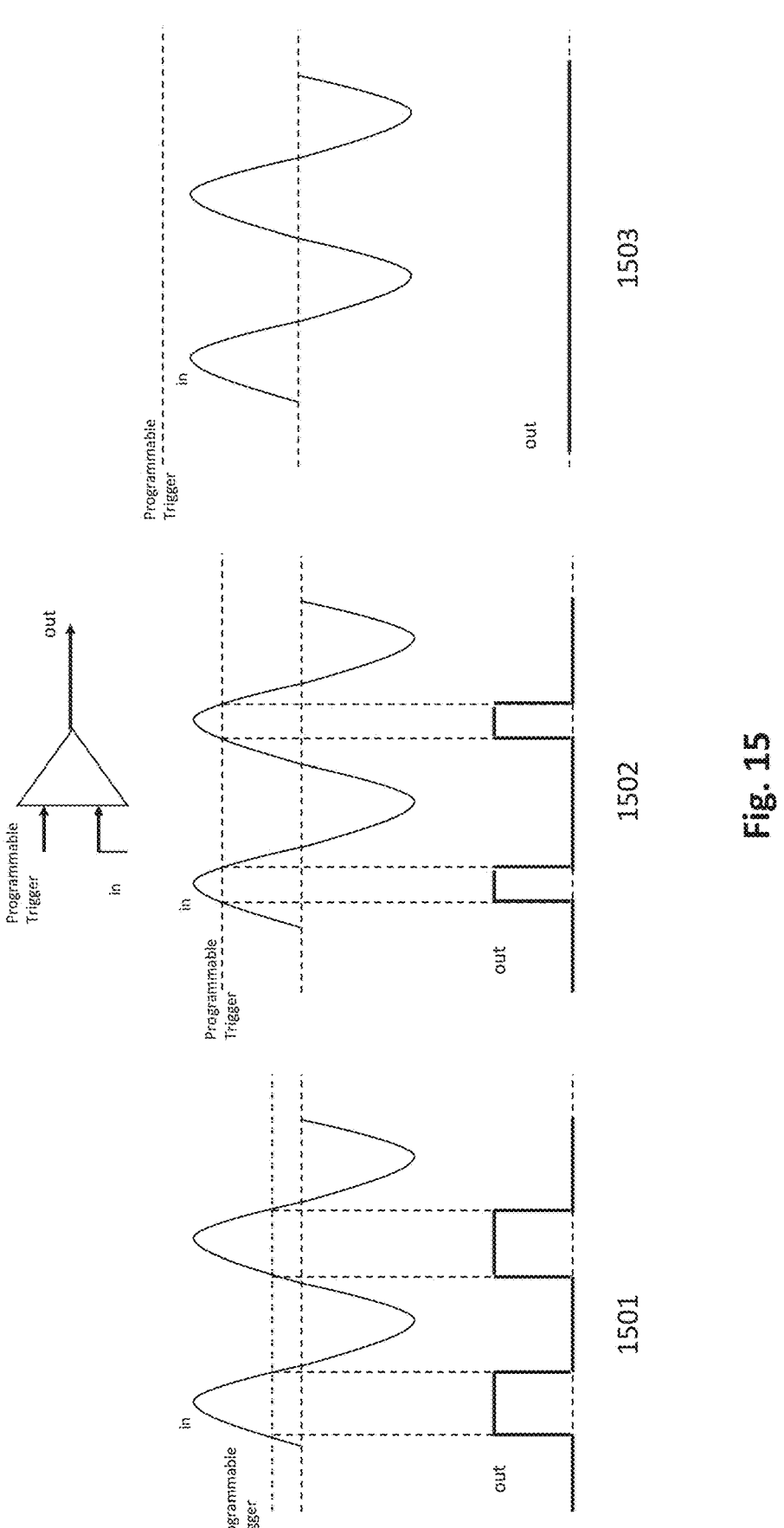
FIG. 15 shows a voltage-time-converter circuit and operation of the voltage-time-converter with different trigger levels relative to the input signal's amplitude.

As such, as observed in FIG. 15, a voltage-to-time converter is used to not only provide rise/fall time information but also signal amplitude information. Here, the voltage-to-time converter circuit behaves akin to a programmable comparator. After a specific trigger level is programmed into the converter, the converter output signal ("out") will be LO when the signal under test (a ring oscillator stage's internal signal, "in") is beneath the trigger level. When the signal rises above the trigger level the converter provides a HI output signal. After the signal falls back beneath the trigger level, the converter output likewise falls back to a LO output signal. FIG. 15 depicts three different examples 1501, 1502, 1503 for three different relative levels of the trigger vs. input signal amplitude.

Here, the rise and fall times of the converter output correspond to when the input signal rises above the threshold and falls beneath the threshold. Additionally, the temporal spacing distance between the rise and fall times of the converter output pulse provide insight into the amplitude of the signal being measured. Specifically, the rise and fall times will converge toward a same time as the peak amplitude of the signal falls toward the trigger level (eventually there are no rise/fall transitions in the converter output signal when the peak amplitude of the signal falls beneath the trigger level). Alternatively or in combination, the trigger level can be swept to provide insight into the internal signal's amplitude (the converter output remains at a LO level when the trigger level is above the signal's peak amplitude).

Note that term NMOS can more generally refer to a n type transistor that does not include an oxide as a gate dielectric (also referred to as "nFET"). Likewise, the term PMOS can more generally refer to a p type transistor that does not include an oxide as a gate dielectric (also referred to as "pFET").

The teachings above have described a first embodiment of a ring oscillator (RO) circuit for capturing one or more characteristics relating to aging of CMOS circuitry in a CMOS device. The RO circuit includes a plurality of stages coupled via an RO feedback signal line and forming an inverter chain. The plurality of stages include, for each stage, a respective CMOS inverter having a pair of pMOS and nMOS transistors followed by a pass gate, wherein an output of a pass gate for a stage is coupled to an input for the respective CMOS inverter of a next stage. The plurality of stages include, an enable stage to enable the inverter chain to be put into a free oscillating mode or another mode in which the RO circuit does not freely oscillate. The plurality of stages include, a Device Under Test (DUT) stage preceded by a pre-stage where respective supply rails of the DUT stage and pre-stage are isolated from one another.

In a second further embodiment, the another mode includes a mode in which: an nMOS transistor in a DUT stage CMOS inverter is isolated from a pMOS transistor in the DUT stage CMOS inverter; and, an I-V characteristic of the nMOS transistor is measured by applying a gate bias to the nMOS transistor through the pass gate of the pre-stage and a drain bias is applied to the nMOS transistor through the pass gate of the DUT stage.

In a third further embodiment, the another mode includes a mode in which: a waveform is applied to an input of a DUT stage CMOS inverter through the pass gate of the enable stage and a pre-stage CMOS inverter.

In a fourth further embodiment, which is a further embodiment of the third further embodiment, the mode includes: applying a supply rail voltage to the pre-stage CMOS inverter that causes a gate of one of the nMOS and pMOS transistors in the DUT stage CMOS inverter to be overdriven.

In a fifth further embodiment, which is a further embodiment of the third further embodiment, the mode includes: applying a supply rail voltage to the pre-stage CMOS inverter that causes a gate of one of the nMOS and pMOS transistors in the DUT stage CMOS inverter to be underdriven.

In a sixth further embodiment, which is a further embodiment of the third further embodiment, the mode includes: applying a supply rail voltage to the DUT stage CMOS inverter that causes a drain of one of the nMOS and pMOS transistors in the DUT stage inverter to be overdriven.

In a seventh further embodiment, which is a further embodiment of the third further embodiment, the mode includes: applying a supply rail voltage to the DUT stage CMOS inverter that causes a drain of one of the nMOS and pMOS transistors in the DUT stage inverter to be underdriven.

In an eighth further embodiment, which is a further embodiment of any of the first, second, third, fourth, fifth, sixth and seventh embodiments, at least one of the stages includes a trigger programmable voltage-to-time converter circuit having an input to receive a signal from the at least one of the stage's CMOS inverter, the trigger programmable voltage-to-time converter circuit capable of determining the signal's amplitude.

The RO circuit of the first through eighth embodiments above has also been described as being part of a wafer of semiconductor chips.

The RO circuit of the first through eighth embodiments above has also been described as being coupled to electronic measurement equipment.

Some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A ring oscillator (RO) circuit, comprising:
a plurality of stages coupled via an RO feedback signal line and forming an inverter chain, the plurality of stages including,
for each stage, a respective Complementary Metal-Oxide Semiconductor (CMOS) inverter comprising a pair of p-channel Metal-Oxide-Semiconductor (pMOS) and N-channel Metal-Oxide-Semiconductor (nMOS) transistors followed by a pass gate, wherein an output of a pass gate for a first stage is coupled to an input for the respective CMOS inverter of a next stage;
an enable stage to enable the inverter chain to be put into a free oscillating mode or a first mode in which the RO circuit does not freely oscillate; and
a Device Under Test (DUT) stage preceded by a pre-stage where respective supply rails of the DUT stage and the pre-stage are coupled to respective CMOS inverters of the DUT stage and the pre-stage and isolated from one another via at least one transistor.

2. The RO circuit of claim 1, wherein the first mode includes a mode in which:
an nMOS transistor in a DUT stage CMOS inverter is isolated from a pMOS transistor in the DUT stage CMOS inverter; and,
a Current-Voltage (I-V) characteristic of the nMOS transistor is measured by applying a gate bias to the nMOS transistor through the pass gate of the pre-stage and a drain bias is applied to the nMOS transistor through the pass gate of the DUT stage.

3. The RO circuit of claim 1, wherein in the first mode, a waveform is applied to an input of a DUT stage CMOS inverter through the pass gate of the enable stage and a pre-stage CMOS inverter.

4. The RO circuit of claim 3, wherein in the first mode, a supply rail voltage is applied to the pre-stage CMOS inverter to cause a gate of one of the nMOS and pMOS transistors in the DUT stage CMOS inverter to be overdriven.

5. The RO circuit of claim 3, wherein in the first mode a supply rail voltage is applied to the pre-stage CMOS inverter to cause a gate of one of the nMOS and pMOS transistors in the DUT stage CMOS inverter to be underdriven.

6. The RO circuit of claim 3, wherein in the first mode includes a supply rail voltage is applied to the DUT stage CMOS inverter cause a drain of one of the nMOS and pMOS transistors in the DUT stage inverter to be overdriven.

7. The RO circuit of claim 3, wherein in the first mode, a supply rail voltage is applied to the DUT stage CMOS inverter to cause a drain of one of the nMOS and pMOS transistors in the DUT stage inverter to be underdriven.

8. The RO circuit of claim 1, wherein at least one of the plurality of stages includes a trigger programmable voltage-to-time converter circuit having an input to receive a signal from the respective CMOS inverter of at least one of the plurality of stages, wherein the trigger programmable voltage-to-time converter circuit is configured to determine an amplitude of the signal.

9. An electronic device, comprising:
a ring oscillator (RO) circuit comprising a plurality of stages coupled via an RO feedback signal line and forming an inverter chain, the plurality of stages including,
for each stage, a respective Complementary Metal-Oxide Semiconductor (CMOS) inverter comprising a pair of p-channel Metal-Oxide-Semiconductor (pMOS) and N-channel Metal-Oxide-Semiconductor (nMOS) transistors followed by a pass gate, wherein an output of a pass gate for a first stage is coupled to an input for the respective CMOS inverter of a next stage;
an enable stage to enable the inverter chain to be put into a free oscillating mode or first mode in which the RO circuit does not freely oscillate;
a Device Under Test (DUT) stage preceded by a pre-stage where respective supply rails of the DUT stage and the pre-stage are coupled to respective CMOS inverters of the DUT stage and the pre-stage and isolated from one another via at least one transistor.

10. The elesctronic device of claim 9, wherein a control transistor is coupled in series with the respective CMOS inverter of the enable stage, and is configured to receive a control signal and enable the inverter chain to operate in one of the free oscillating mode and the first mode based on the control signal.

11. The electronic device of claim 10, wherein the first mode includes a mode in which:
an nMOS transistor in a DUT stage CMOS inverter is isolated from a pMOS transistor in the DUT stage CMOS inverter; and
a Current-Voltage (I-V) characteristic of the nMOS transistor is measured by applying a gate bias to the nMOS transistor through the pass gate of the pre-stage and a drain bias is applied to the nMOS transistor through the pass gate of the DUT stage.

12. The electronic device of claim 10, wherein in the first mode, a waveform is applied to an input of a DUT stage CMOS inverter through the pass gate of the enable stage and a pre-stage CMOS inverter.

13. The electronic device of claim 12, wherein in the first mode, a supply rail voltage is applied to the pre-stage CMOS inverter to cause a gate of one of the nMOS and pMOS transistors in the DUT stage CMOS inverter to be overdriven or underdriven.

14. The electronic device of claim 12, wherein in the first mode, a supply rail voltage to the DUT stage CMOS inverter to cause a drain of one of the nMOS and pMOS transistors in the DUT stage inverter to be overdriven.

15. The electronic device of claim 12, wherein in the first mode, a supply rail voltage to the DUT stage CMOS inverter to cause a drain of one of the nMOS and pMOS transistors in the DUT stage inverter to be underdriven.

16. The electronic device of claim 10, wherein at least one of the plurality of stages includes a trigger programmable voltage-to-time converter circuit having an input to receive a signal from the respective CMOS inverter of at least one of the plurality of stages, wherein the trigger programmable voltage-to-time converter circuit is configured to determine an amplitude of the signal.

17. An apparatus, comprising:

electronic measurement equipment coupled to a ring oscillator (RO) circuit for capturing one or more characteristics relating to aging of CMOS circuitry in a CMOS device, the RO circuit, comprising:

a plurality of stages coupled via an RO feedback signal line and forming an inverter chain, the plurality of stages including:

for each stage, a respective Complementary Metal-Oxide Semiconductor (CMOS) inverter comprising a pair of p-channel Metal-Oxide-Semiconductor (pMOS) and N-channel Metal-Oxide-Semiconductor (nMOS) transistors followed by a pass gate, wherein an output of a pass gate for a first stage is coupled to an input for the respective CMOS inverter of a next stage;

an enable stage to enable the inverter chain to be put into a free oscillating mode or a first mode in which the RO circuit does not freely oscillate; and a Device Under Test (DUT) stage preceded by a pre-stage where respective supply rails of the DUT stage and the pre-stage are coupled to respective CMOS inverters of the DUT stage and the pre-stage and isolated from one another via at least one transistor.

18. The apparatus of claim 17, wherein in the first mode, a waveform is applied to an input of a DUT stage CMOS inverter through the pass gate of the enable stage and a pre-stage CMOS inverter.

19. The apparatus of claim 18, wherein in the first mode, a supply rail voltage is applied to the pre-stage CMOS inverter a gate of one of the nMOS and pMOS transistors in the DUT stage CMOS inverter to be overdriven.

20. The apparatus of claim 18, wherein in the first mode, a supply rail voltage is applied to the DUT stage CMOS inverter to cause a drain of one of the nMOS and pMOS transistors in the DUT stage inverter to be overdriven.

* * * * *